United States Patent
Zhang et al.

(10) Patent No.: US 10,297,330 B2
(45) Date of Patent: May 21, 2019

(54) SEPARATE DRAIN-SIDE DUMMY WORD LINES WITHIN A BLOCK TO REDUCE PROGRAM DISTURB

(71) Applicant: SanDisk Technologies LLC, Plano, TX (US)

(72) Inventors: Zhengyi Zhang, Mountain View, CA (US); Henry Chin, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 25 days.

(21) Appl. No.: 15/615,972

(22) Filed: Jun. 7, 2017

(65) Prior Publication Data

US 2018/0358102 A1    Dec. 13, 2018

(51) Int. Cl.
*G11C 16/04* (2006.01)
*G11C 16/34* (2006.01)
*G11C 16/12* (2006.01)
*G11C 8/14* (2006.01)
*G11C 8/12* (2006.01)
(Continued)

(52) U.S. Cl.
CPC ............ *G11C 16/3459* (2013.01); *G11C 8/08* (2013.01); *G11C 8/12* (2013.01); *G11C 8/14* (2013.01); *G11C 8/16* (2013.01); *G11C 16/0483* (2013.01); *G11C 16/08* (2013.01); *G11C 16/10* (2013.01); *G11C 16/12* (2013.01); *G11C 16/24* (2013.01); *G11C 16/3418* (2013.01);
(Continued)

(58) Field of Classification Search
CPC .......... G11C 8/14; G11C 8/16; G11C 16/0483
See application file for complete search history.

(56) References Cited

U.S. PATENT DOCUMENTS 8,394,716 B2   3/2013   Hwang et al.
8,982,626 B2   3/2015   Dong et al.
(Continued)

FOREIGN PATENT DOCUMENTS

WO    WO2016/081172 A1    5/2016

OTHER PUBLICATIONS

U.S. Appl. No. 15/437,718, filed Feb. 21, 2017 by Zhang et al.
(Continued)

*Primary Examiner* — Amir Zarabian
*Assistant Examiner* — Jay W. Radke
(74) *Attorney, Agent, or Firm* — Vierra Magen Marcus LLP

(57) ABSTRACT

Disturbs are reduced during programming and read operations for drain-side memory cells in a string by controlling dummy word line portions separately in selected and unselected sub-blocks. One or more of the dummy word line layers are separated so that they can be driven with different voltages. This allows the channel gradient to be optimized to reduce the likelihood of disturbs. In another aspect, a stack of alternating conductive and dielectric layers is formed in two parts, with lower pillars which comprise select gate transistors, source-side dummy memory cells and data memory cells, below upper pillars which comprise drain-side dummy memory cells and select gate transistors. The upper pillars are relatively narrow to provide a more compact structure. Moreover, the centerline of some upper pillars can be offset from the centerline of corresponding lower pillars to provide room for an isolation region.

18 Claims, 34 Drawing Sheets

(51) Int. Cl.
*G11C 8/16* (2006.01)
*G11C 8/08* (2006.01)
*G11C 16/08* (2006.01)
*G11C 16/10* (2006.01)
*G11C 16/24* (2006.01)
G11C 16/16 (2006.01)
H01L 27/11582 (2017.01)

(52) U.S. Cl.
CPC .......... *G11C 16/3427* (2013.01); *G11C 16/16* (2013.01); *H01L 27/11582* (2013.01)

(56) References Cited

U.S. PATENT DOCUMENTS

| | | |
|---|---|---|
| 9,035,372 B2 | 5/2015 | Song |
| 9,123,425 B2 | 9/2015 | Dong et al. |
| 9,406,693 B1 | 8/2016 | Pang et al. |
| 9,490,262 B1 | 11/2016 | Pang et al. |
| 9,496,038 B1* | 11/2016 | Kwak ................ G11C 16/0483 |
| 2010/0046294 A1* | 2/2010 | Jeong ................ G11C 16/0483 |
| | | 365/185.17 |
| 2010/0109071 A1 | 5/2010 | Tanaka et al. |
| 2011/0317489 A1 | 12/2011 | Kim et al. |
| 2012/0051143 A1 | 3/2012 | Yoon et al. |
| 2012/0120740 A1 | 5/2012 | Shim et al. |
| 2014/0080297 A1 | 3/2014 | Mizushima et al. |
| 2015/0236036 A1 | 8/2015 | Shim |
| 2016/0071592 A1* | 3/2016 | Nam ...................... G11C 16/16 |
| | | 365/185.12 |
| 2016/0254047 A1* | 9/2016 | Sun ...................... G11C 11/5628 |
| | | 365/185.03 |
| 2016/0293266 A1 | 10/2016 | Chen et al. |

OTHER PUBLICATIONS

International Search Report & The Written Opinion of the International Search Authority dated Jun. 20, 2018, International Application No. PCT/US2018/021065.

* cited by examiner

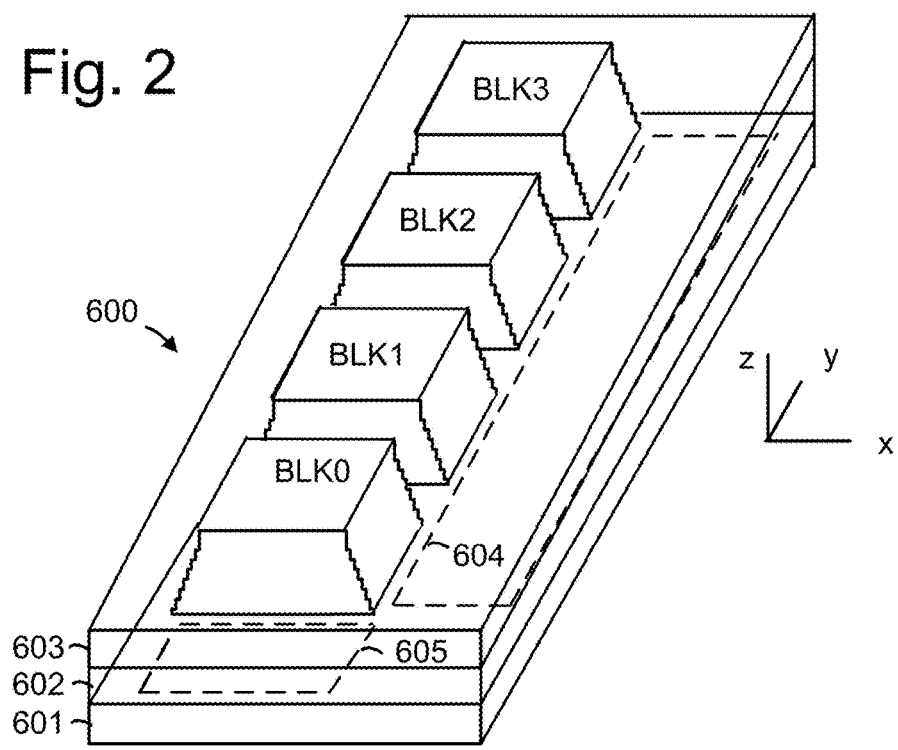

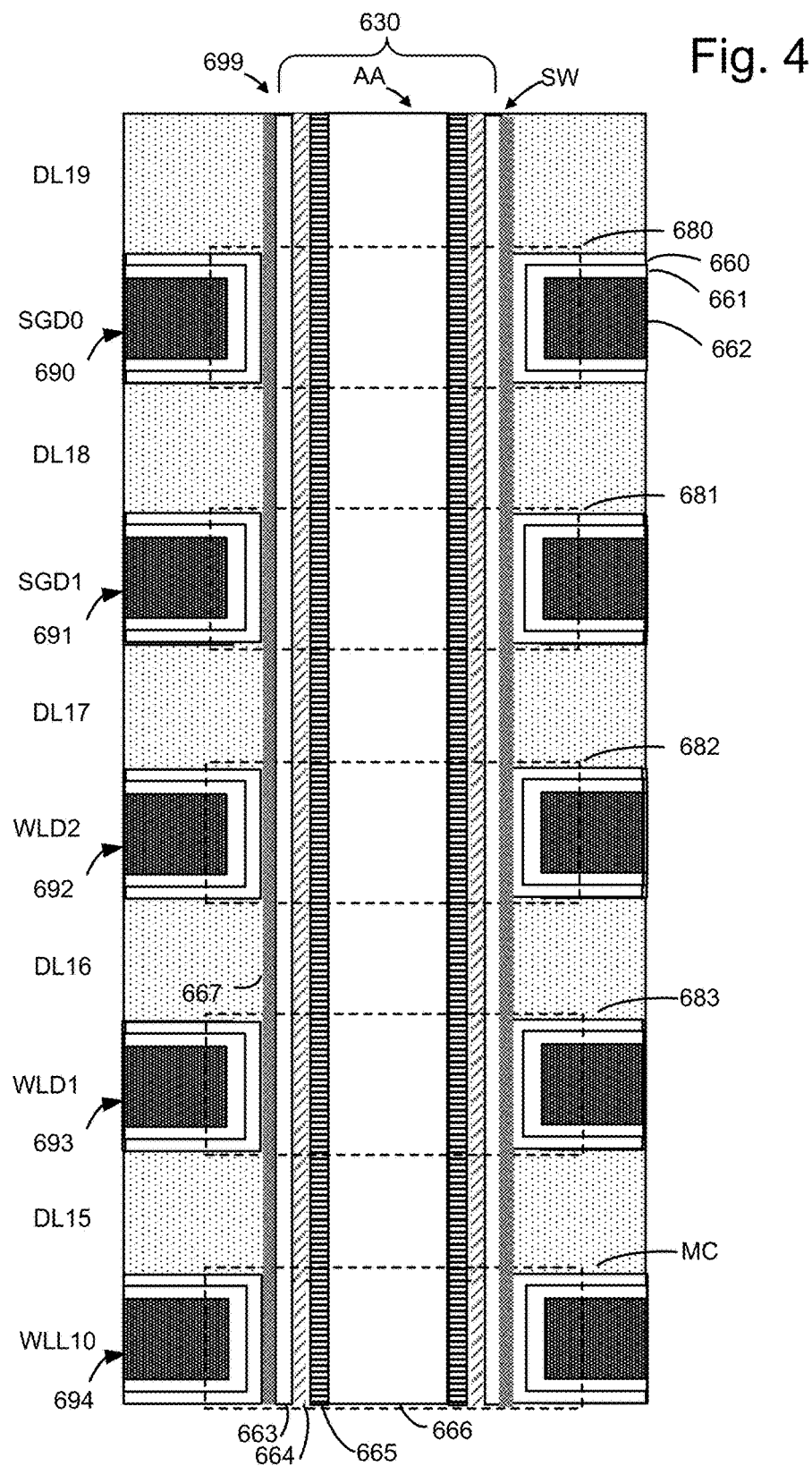

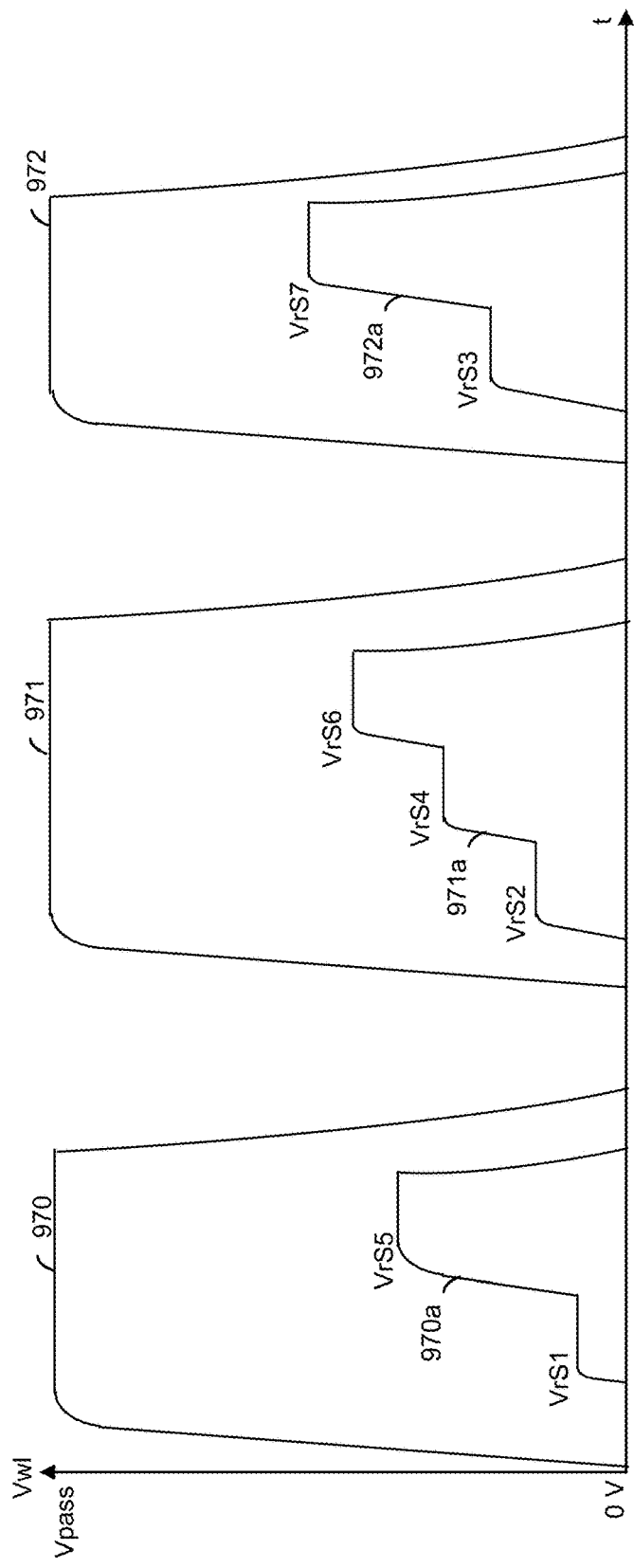

Fig. 8A
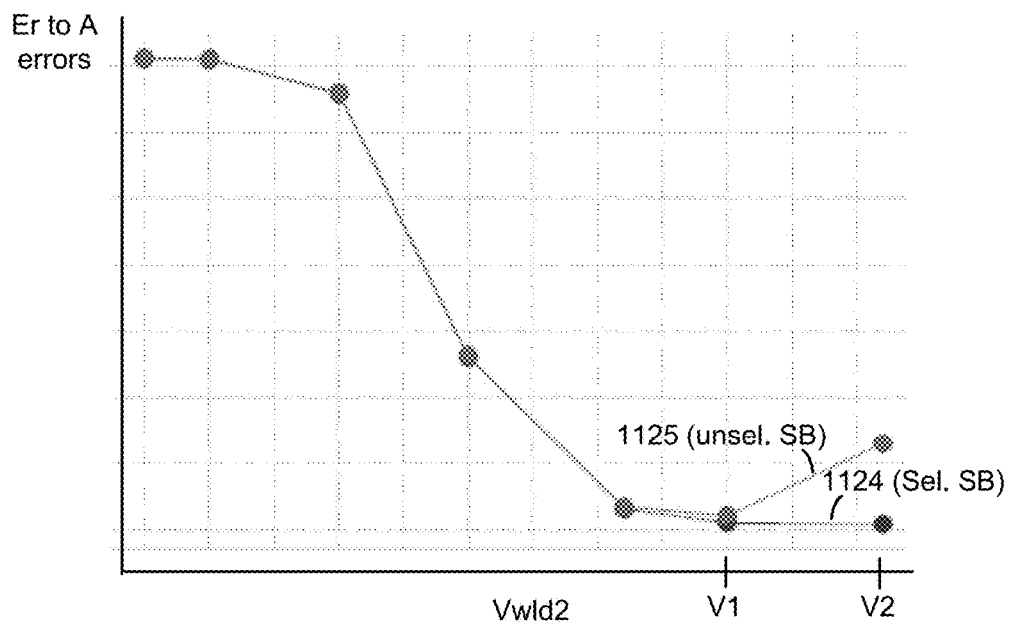
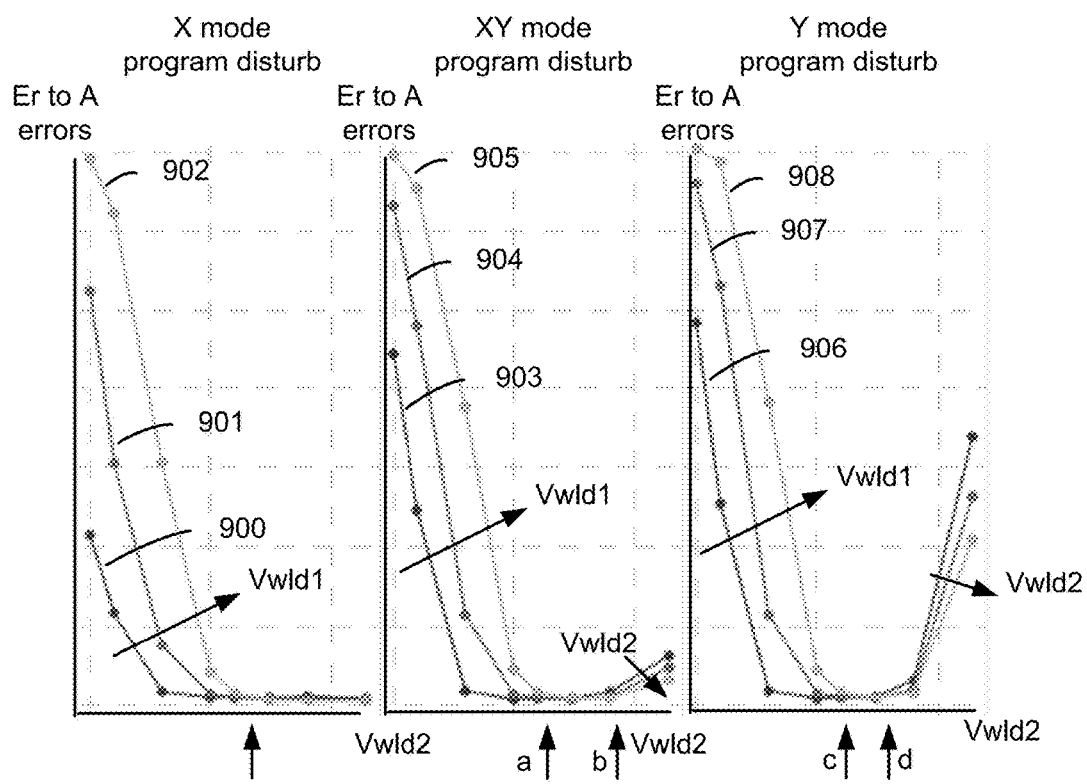
Fig. 8B    Fig. 8C    Fig. 8D

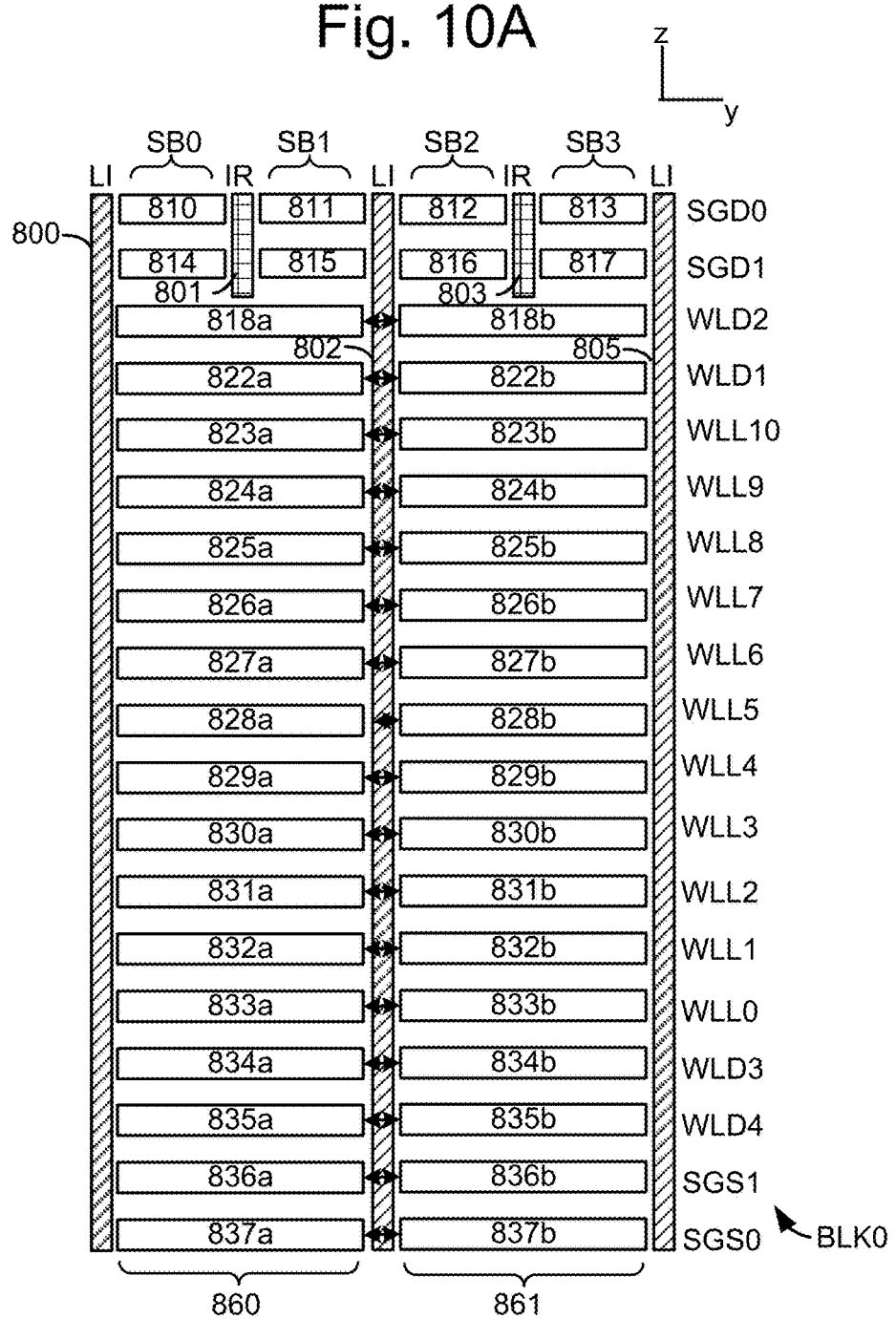

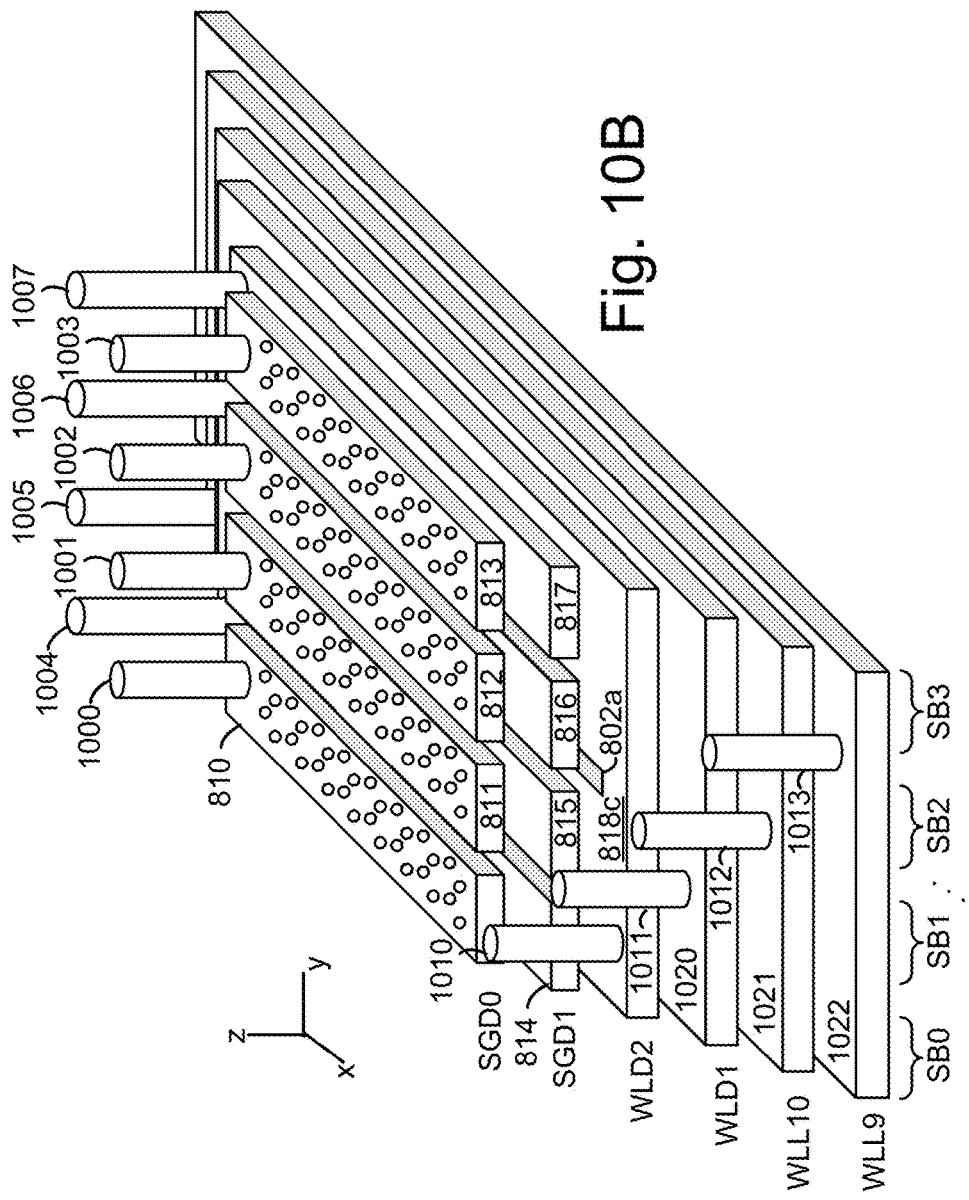

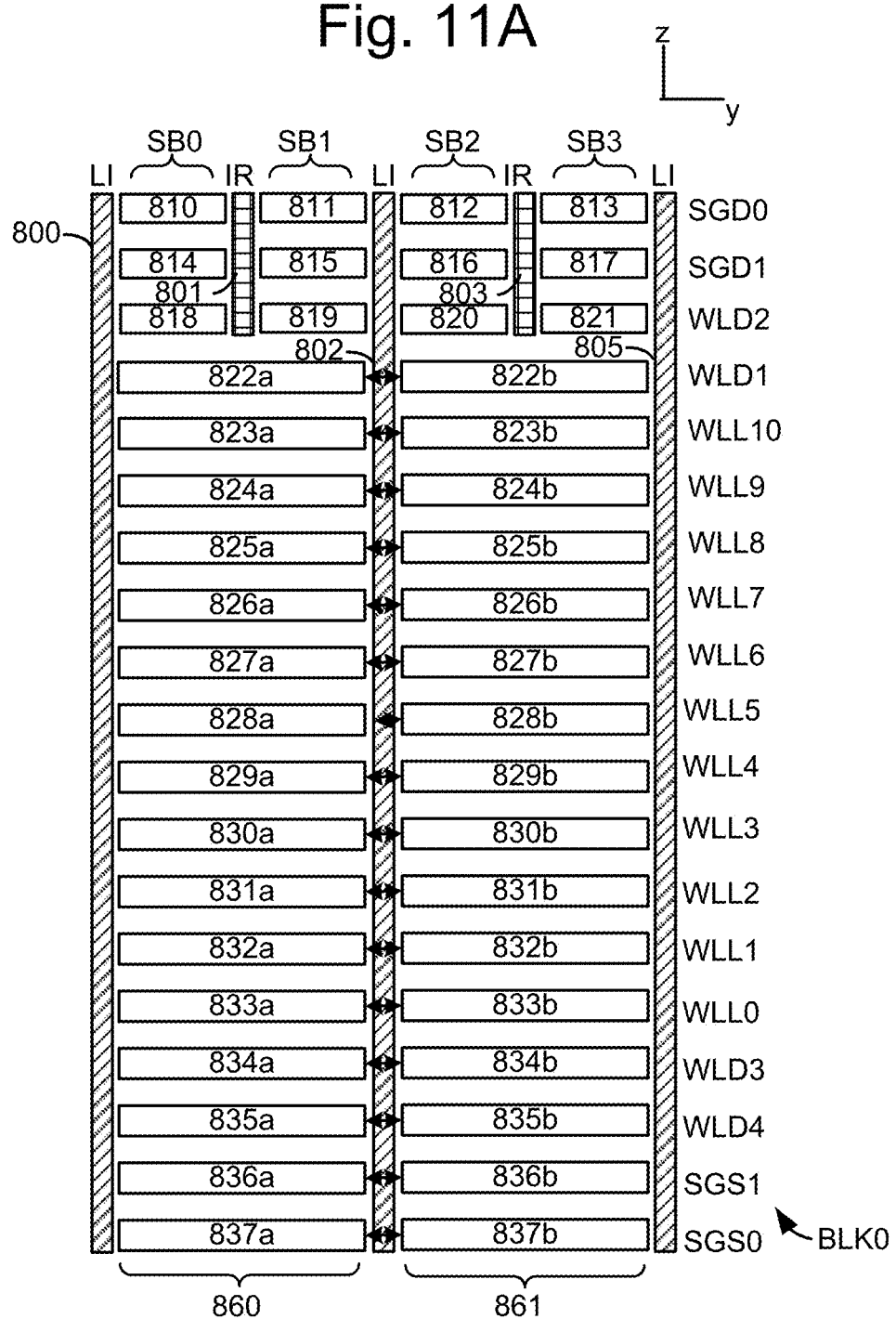

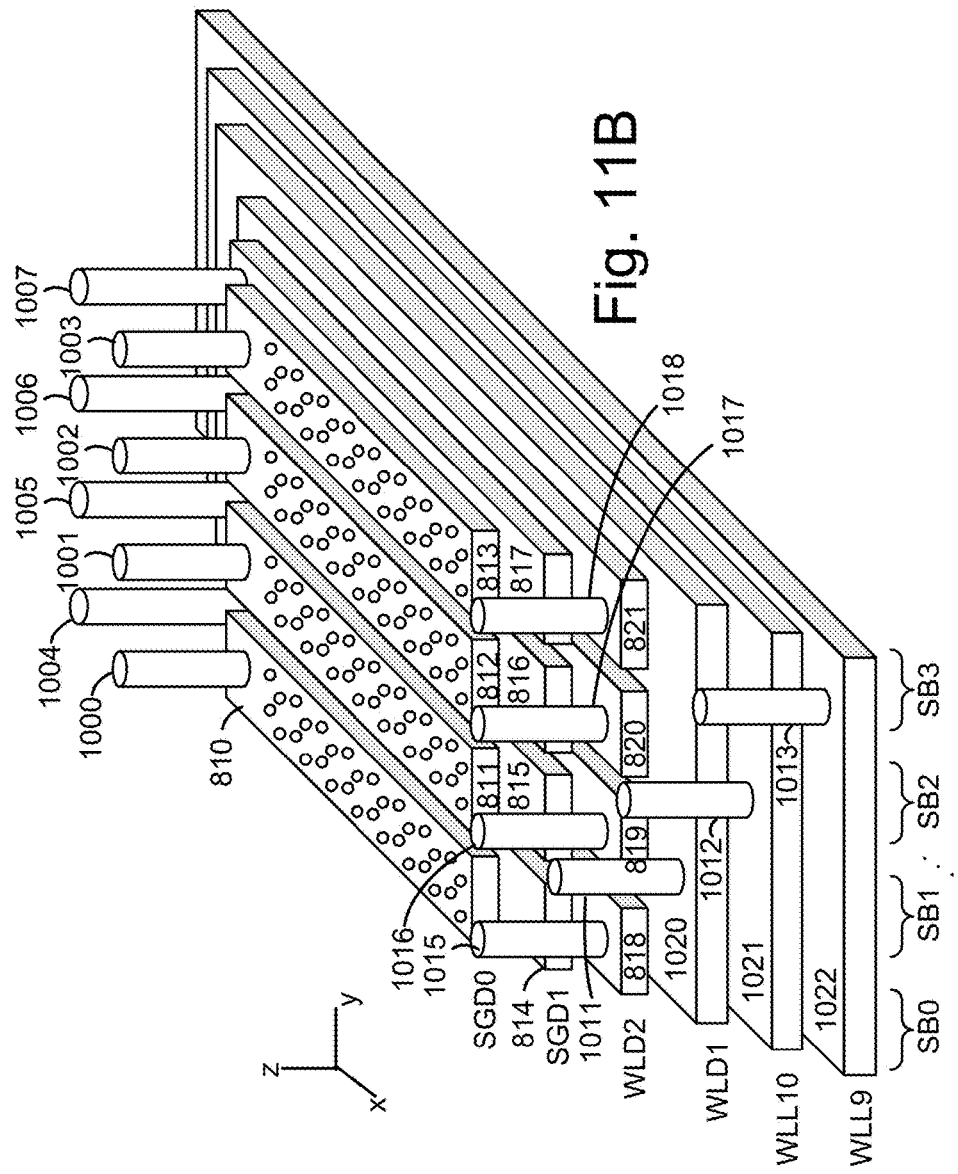

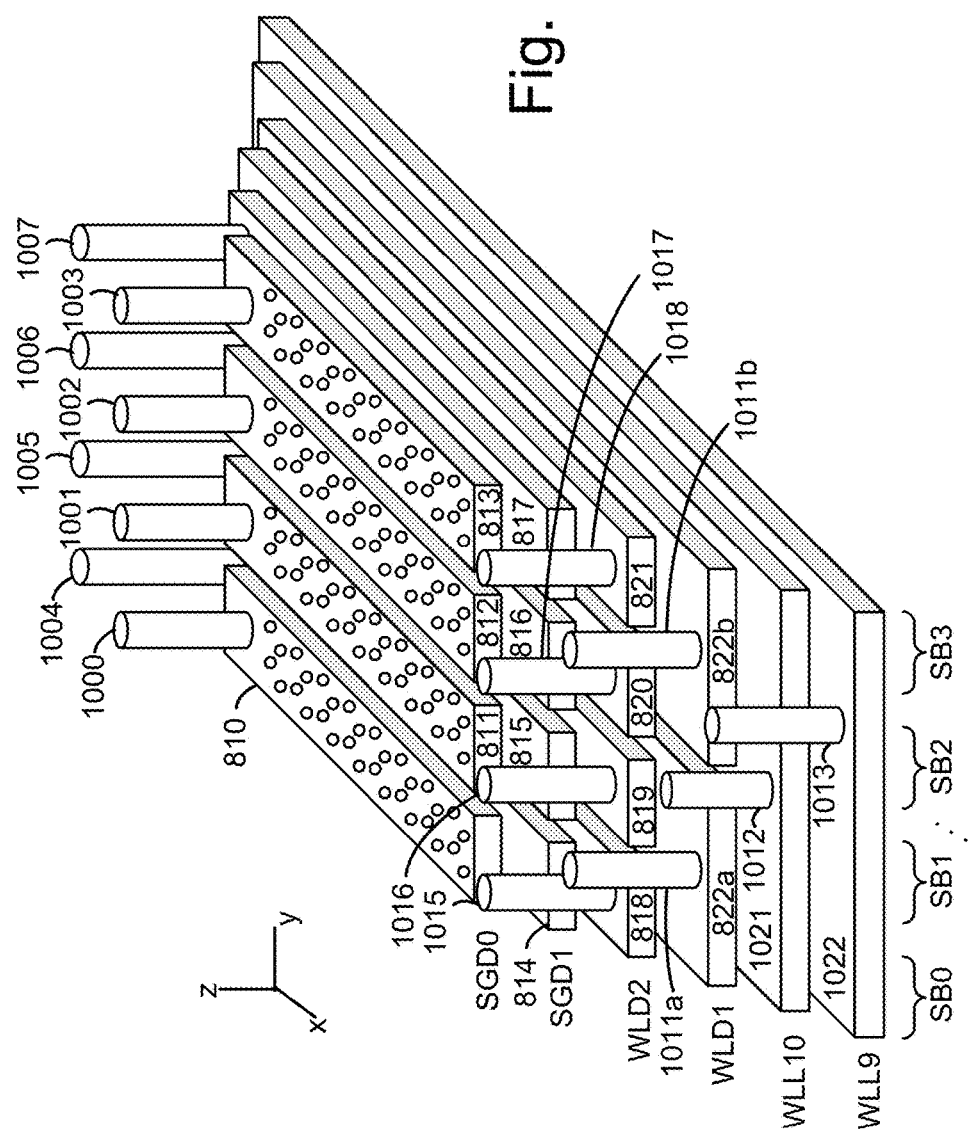

1400

| DL19 | | SGD0 |
| DL18 | | SGD1 |
| DL17 | | WLD2 |
| DL16 | | WLD1 |
| DL15 | | WLL10 |
| DL14 | | WLL9 |
| DL13 | | WLL8 |
| DL12 | | WLL7 |
| DL11 | | WLL6 |
| DL10 | | WLL5 |
| DL9 | | WLL4 |
| DL8 | | WLL3 |
| DL7 | | WLL2 |
| DL6 | | WLL1 |
| DL5 | | WLL0 |
| DL4 | | WLD3 |
| DL3 | | WLD4 |
| DL2 | | SGS1 |
| DL1 | | SGS0 |
| DL0 | | |

611

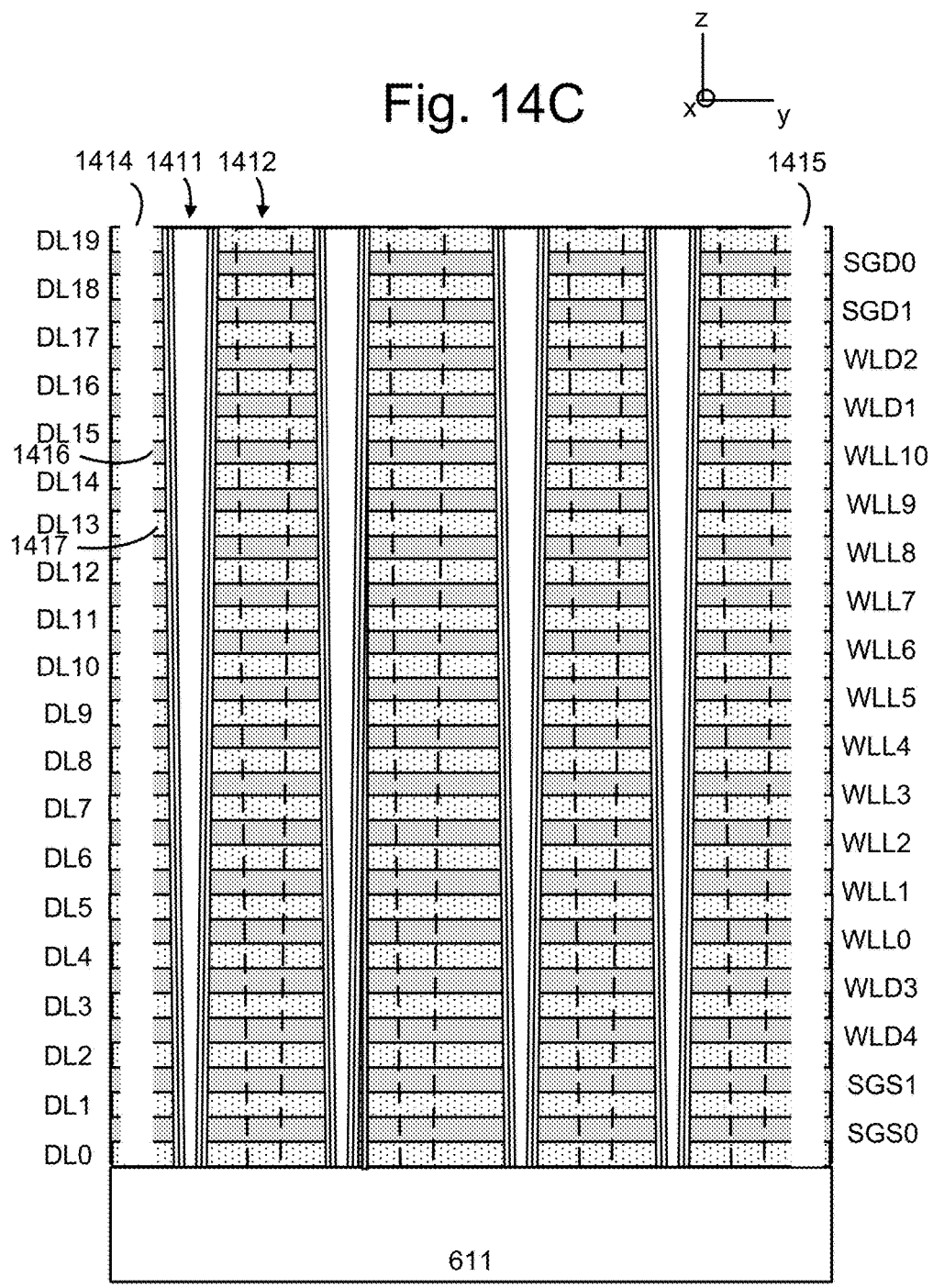

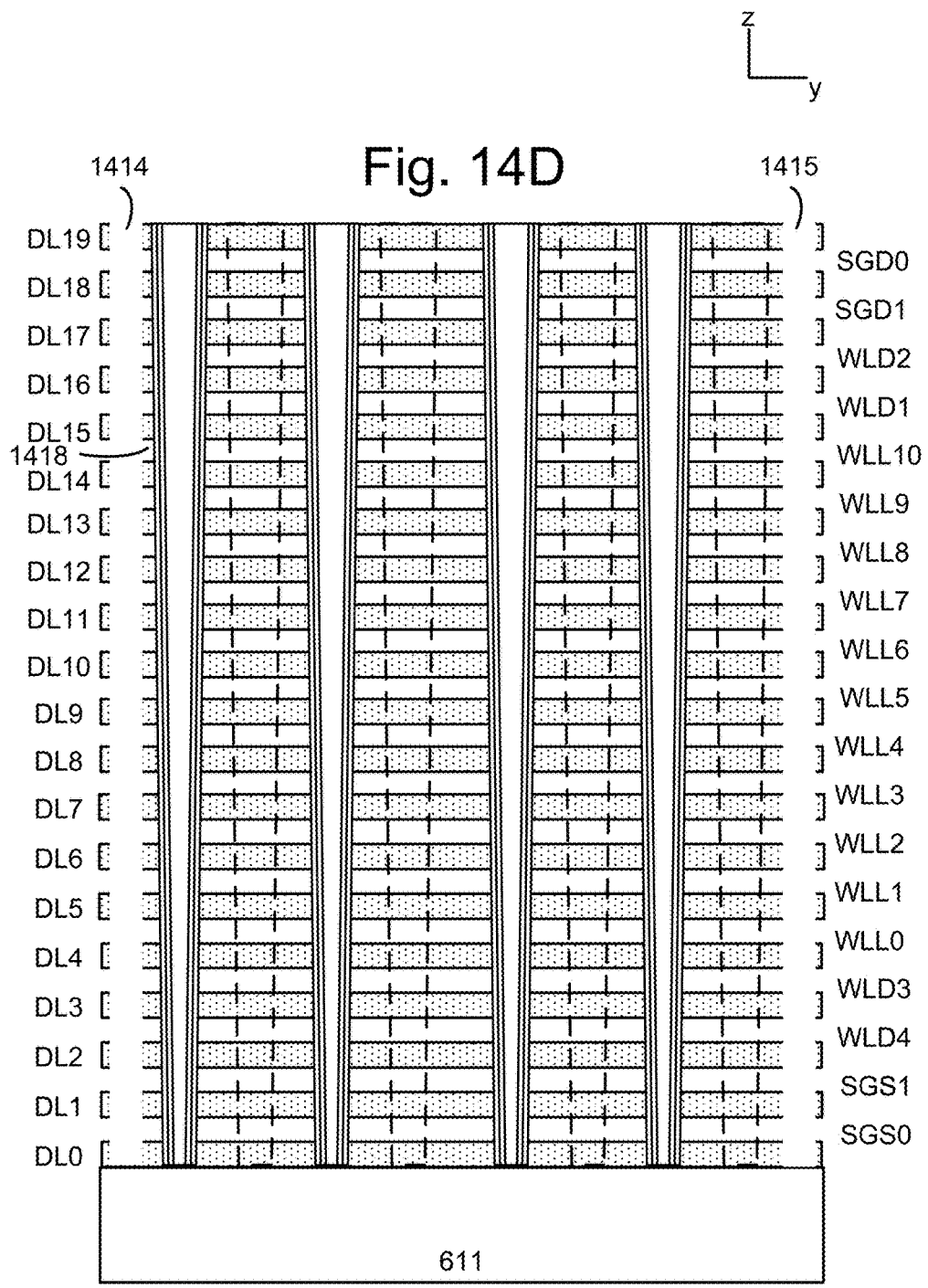

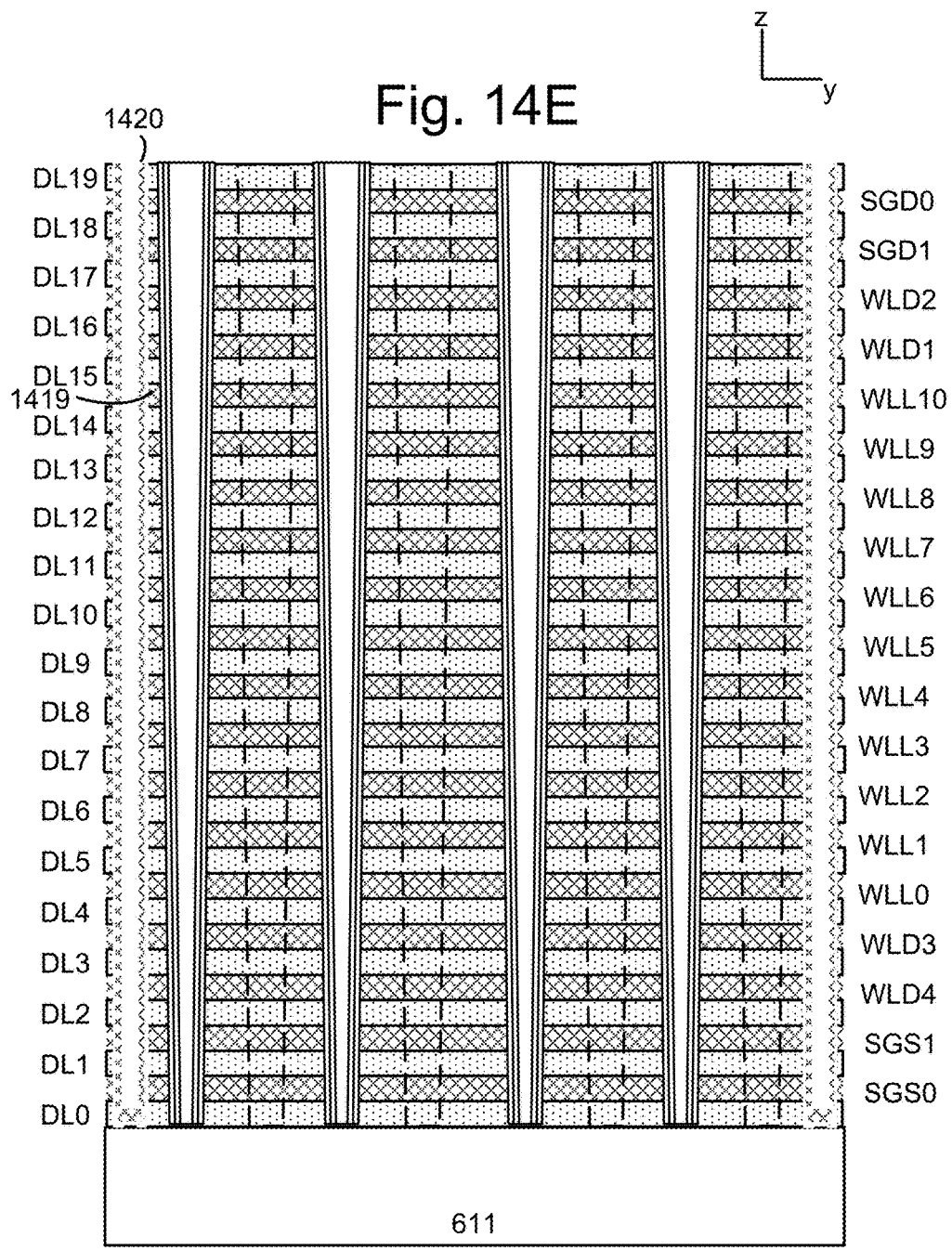

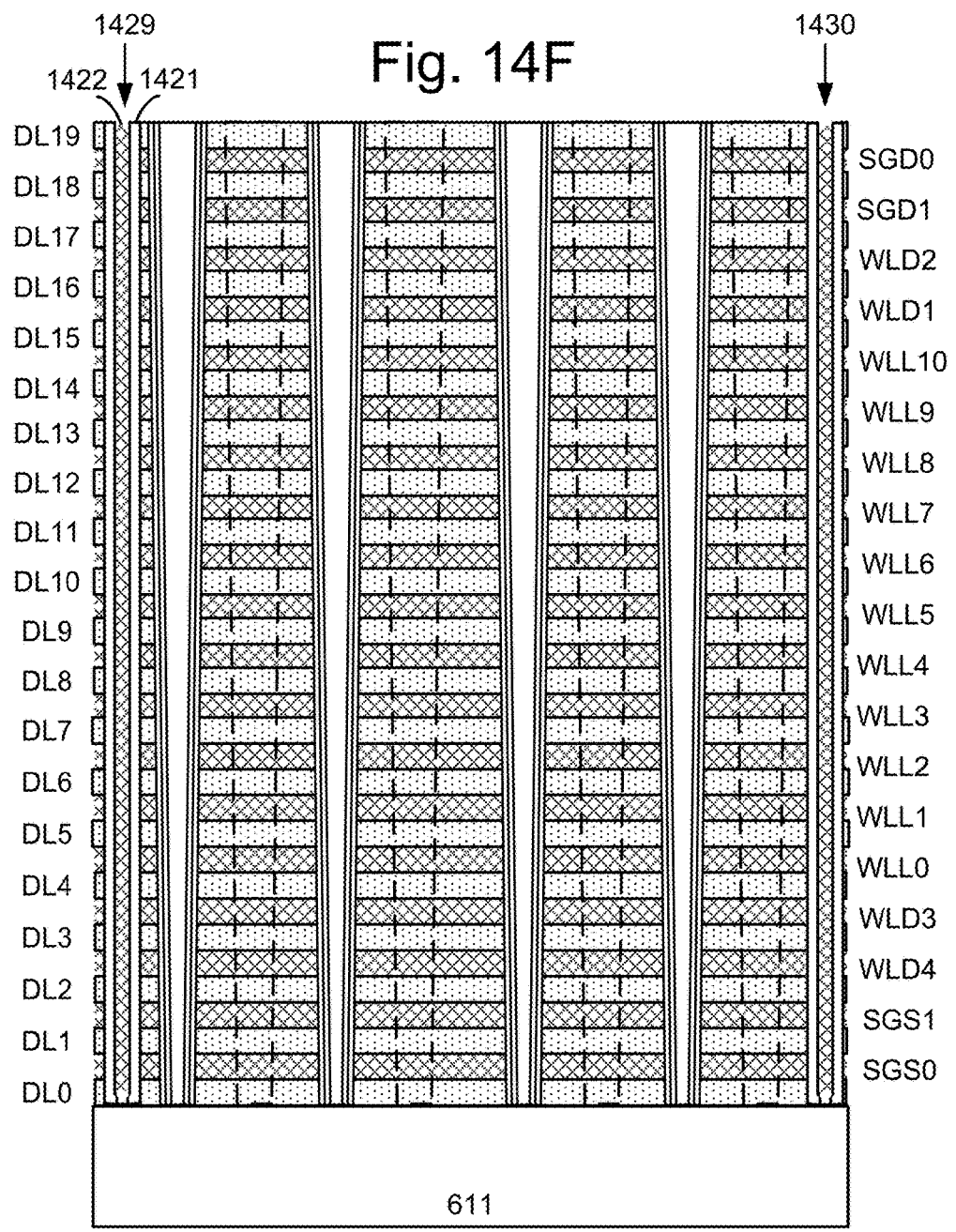

SEPARATE DRAIN-SIDE DUMMY WORD LINES WITHIN A BLOCK TO REDUCE PROGRAM DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

Like-numbered elements refer to common components in the different figures.

FIG. 2 is a perspective view of a memory device 600 comprising a set of blocks in a plane in an example 3D configuration of the memory structure 126 of FIG. 1.

FIG. 4 depicts a close-up view of the region 622 of the stack of FIG. 3A.

FIG. 7B depicts a plot of example waveforms in a read operation.

FIG. 8A depicts a plot of Er-to-A state errors versus Vwld2, consistent with FIGS. 5A, 5B and 6A.

FIG. 8B depicts a plot of a number of cells experiencing X mode (same sub-block, different bit line) program disturb versus Vwld2 for three different levels of Vwld1.

FIG. 8C depicts a plot of a number of cells experiencing XY mode (different sub-block, different bit line) program disturb versus Vwld2 for three different levels of Vwld1.

FIG. 8D depicts a plot of a number of cells experiencing Y mode (different sub-block, same bit line) program disturb versus Vwld2 for three different levels of Vwld1.

FIG. 10A depicts an example cross-sectional view of a block BLK0 of memory cells where each dummy word line layer is shared among all sub-blocks.

FIG. 10B depicts an example perspective view of a portion of the block BLK0 of FIG. 10A.

FIG. 11A depicts an example cross-sectional view of a block BLK0 of memory cells where portions of the dummy word line layer WLD2 are separate for each sub-block and the dummy word line layer WLD1 is shared among all sub-blocks.

FIG. 11B depicts an example perspective view of a portion of the block BLK0 of FIG. 11A.

FIG. 11C depicts an example perspective view of a portion of the block BLK0 of FIG. 11A with a modification in which one portion of the dummy word line layer WLD1 is shared by sub-blocks SB0 and SB1 and another portion of the dummy word line layer WLD1 is shared by sub-blocks SB1 and SB2.

FIG. 14C depicts an example cross-sectional view of the stack of FIG. 14B after slits 1414 and 1415 are formed in the stack, consistent with step 1304 of FIG. 13A.

FIG. 14D depicts an example cross-sectional view of the stack of FIG. 14C after the sacrificial material 1416 of the control gate layers is removed by providing an etchant in the slit, thereby forming a void 1418, consistent with step 1305 of FIG. 13A.

FIG. 14E depicts an example cross-sectional view of the stack of FIG. 14D after depositing a metal in the control gate layers via the slit, consistent with step 1306 of FIG. 13A.

FIG. 14F depicts an example cross-sectional view of the stack of FIG. 14E after cleaning and filling in the slit, consistent with step 1306 of FIG. 13A.

DETAILED DESCRIPTION

Figure 1A:
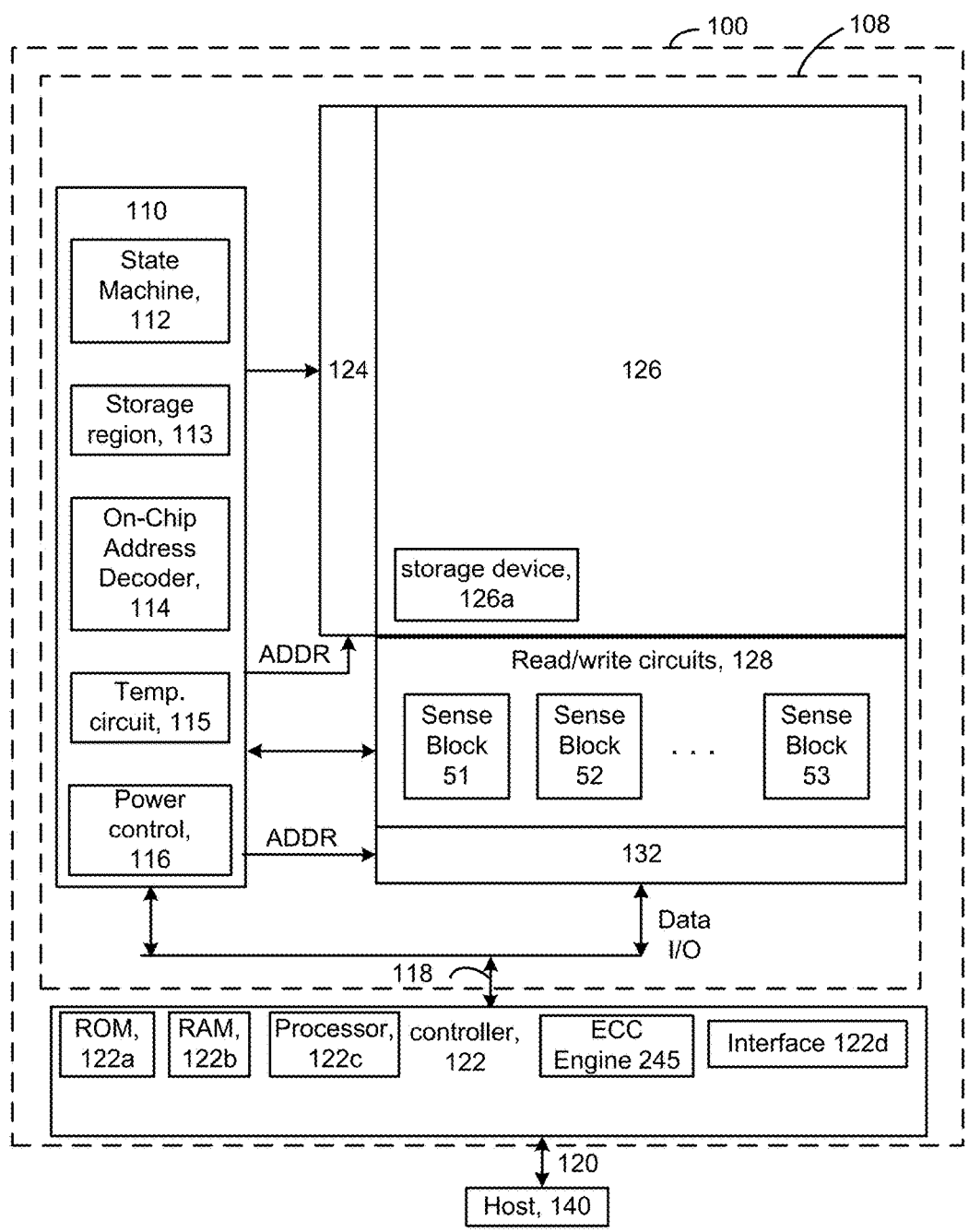
FIG. 1A is a block diagram of an example memory device.

A memory device such as a 3D stacked non-volatile memory device is provided in which disturbs are reduced, in particular, for a drain-side data memory cell in a string of memory cells. Techniques for fabricating and operating such as memory device are also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends between the source side of a block and the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory strings extend in memory holes which are formed in the stack.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 6A). In a three-bit per cell memory device, there are eight data states including the erased state Er or S0 and seven higher data states referred to as the S1-S7 data states (see FIG. 6B). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, during programming and read operations, disturbs can occur, especially for the drain-side or edge memory cells in a string. The disturbs can increase the threshold voltage of the memory cell, potentially resulting in read errors.

Techniques provided herein address the above and other issues. In one aspect, a memory device is provided in which one or more of the dummy word line layers are separated into portions which can be driven with different voltages. This allows a channel gradient in the memory string to be optimized in a way which reduces the likelihood of disturbs on the drain-side data memory cells. In particular, the likelihood of disturbs is reduced on the drain-side data memory cells of unselected sub-blocks when an operation such as programming or read operation occurs for selected cells in a selected sub-block.

In one aspect, the topmost dummy word line layer at the drain-side of a block includes a separate portion for each sub-block (assume a number N sub-blocks in a block, where N>1), while one or more other dummy word line layers below the topmost layer either include a common portion which is shared by all N sub-blocks, or some number of separate word line layer portions which is less than N but more than one.

In another aspect, the stack of alternating conductive and dielectric layers is formed in two parts, with lower pillars which comprise SGS transistors, source-side dummy memory cells and data memory cells, below upper pillars which comprise drain-side dummy memory cells and SGD transistors. The upper pillars are relatively narrow so that a more compact structure can be provided. Moreover, the centerline of some upper pillars can be offset from the centerline of corresponding lower pillars to provide room for an isolation region which separates one or more SGD layers and one or more drain-side dummy word line layers.

In another aspect, a method for operating a memory device includes setting voltages for dummy word lines based on variables such as the magnitude of a program or read voltage, a temperature, a number of program-erase (PE) cycles of a block or sub-block, an error count from one or more previous read operations in the block or sub-block and/or the selected word line position, e.g., whether or not it is a drain-side memory cell.

The above and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The temperature-sensing circuit may detect a temperature of the memory device. The temperature can be used to adjust voltages as discussed further below, e.g., at step 1332a of FIG. 13C. See FIG. 1B for further details of a temperature-sensing circuit.

The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end or source side of a NAND string, and an SGD transistor is a select gate transistor at a drain-end or drain side of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 124 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate memory controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
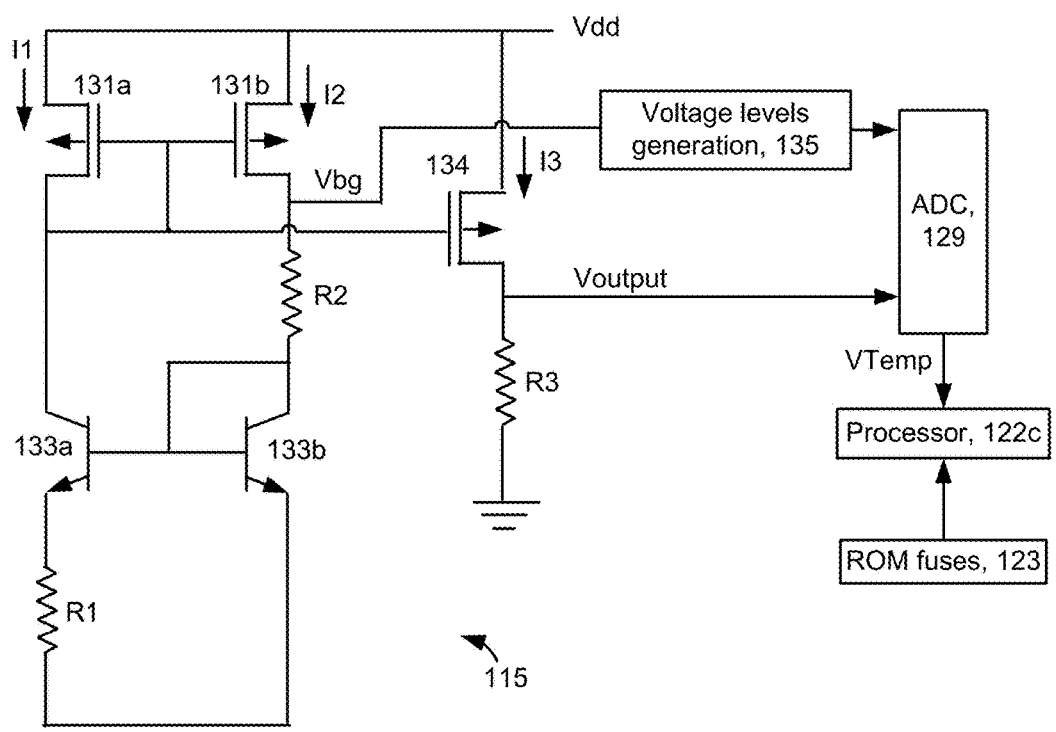
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a perspective view of a memory device 600 comprising a set of blocks in a plane in an example 3D configuration of the memory structure 126 of FIG. 1. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks.

The circuitry can include voltage drivers which can be connected to control gate layers, bit lines and source lines of the blocks. See FIG. 18. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figures 3A, 3B:
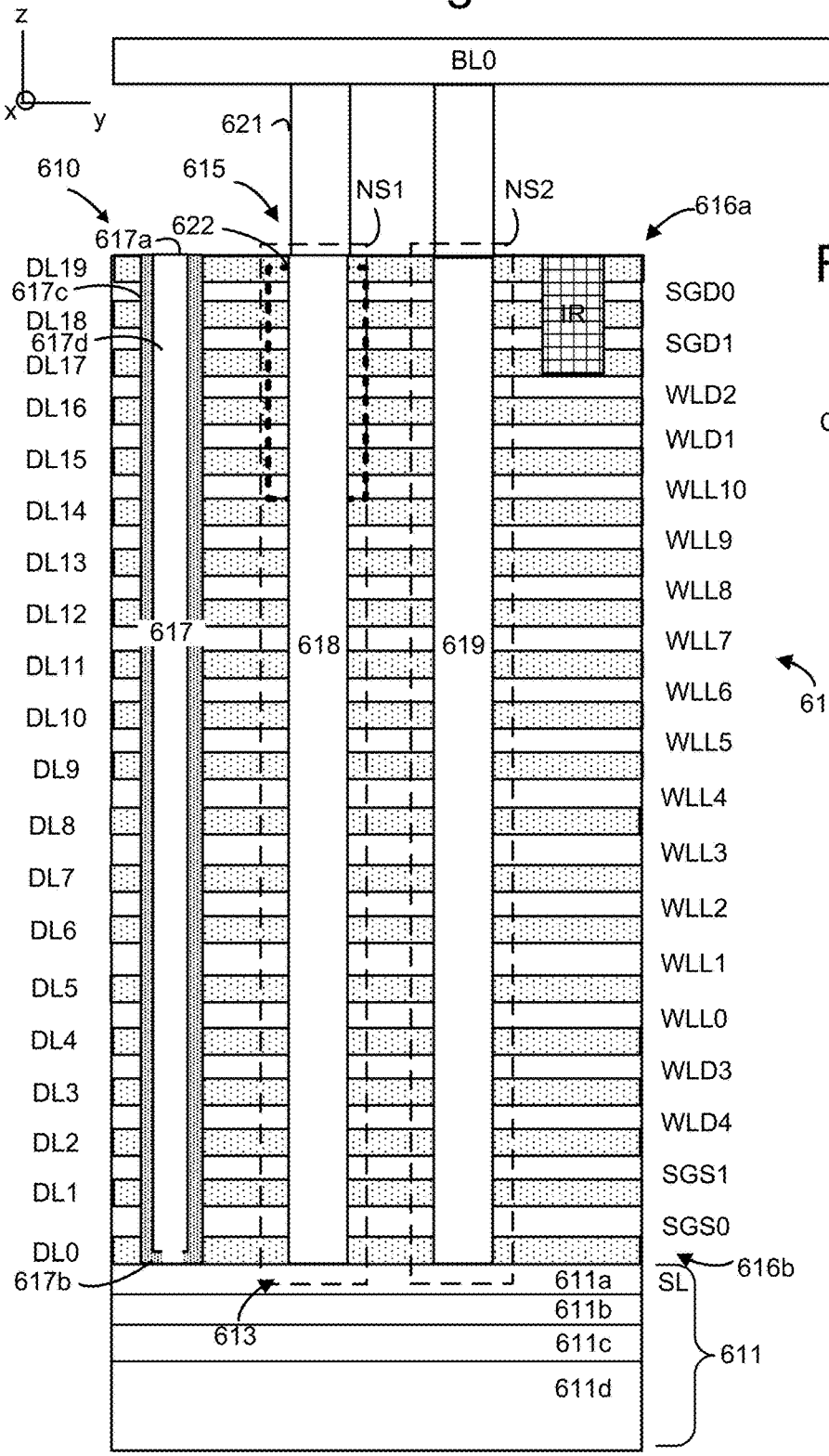
FIG. 3A depicts an example cross-sectional view of a portion of one of the blocks of FIG. 2.
FIG. 3B depicts an example transistor 500.

FIG. 3A depicts an example cross-sectional view of a portion of one of the blocks of FIG. 2. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. WLD2 is a topmost dummy word line layer, and WLD1 is another dummy word line layer which is below the topmost dummy word line layer and above the topmost or drain-side data word line WLL10. WLD3 and WLD4 are source side dummy word line layers. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 4.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617d is isolated from the word line layers by an insulating material 617c. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617c is deposited along the sidewalls of the slits. A hole is etched in the bottom of the insulation layer. The remainder of the slits is filled with the metal 617d which extends through the hole to the substrate and up to the top of the stack, thus forming a conductive path or local interconnect from the bottom to the top of the stack. See also the process of FIG. 13A and associated figures.

A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is etched through to provide a contact to the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects, e.g., pillars or posts, connect to each layer, including the SGS, WL and SGD layers, and extend upward to horizontal paths to voltage sources. See FIG. 15.

This example includes two SGD transistors, two drain side dummy memory cells, two source side dummy memory cells and two SGS transistors in each string, as an example. Generally, one or more SGD transistors and one or more SGS transistors may be provided in a memory string.

An isolation region IR may be provided to separate portions of the SGD layers from one another to provide one independently driven SGD line or layer portion per sub-block. The isolation region comprises an insulating material such as oxide. In one example, the word line layers are common to all sub-blocks in a block. The drain-side dummy word line layers may have a separate portion for each sub-block, a portion which is shared by multiple sub-blocks of a block but fewer than all sub-blocks of the block and/or a single portion which is shared by all sub-blocks of a block. Example configurations are provided, e.g., in FIG. 10A to 12B.

FIG. 3B depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

FIG. 4 depicts a close-up view of the region 622 of the stack of FIG. 3A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664 (such as oxide), a channel 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

In the example of FIG. 4, the SGD transistors are formed at the same time as the memory cells and share the memory films. In another possible approach, the SGD transistors are formed after the memory cells are formed and do not include the memory films. In this case, the SGD transistors may be doped to provide a desired Vth level without the use of memory films. In one embodiment, the memory holes are formed and filled in, after which the SGD layers are deposited and etched through to form a conductive path to a top of the memory hole.

Figure 5A:
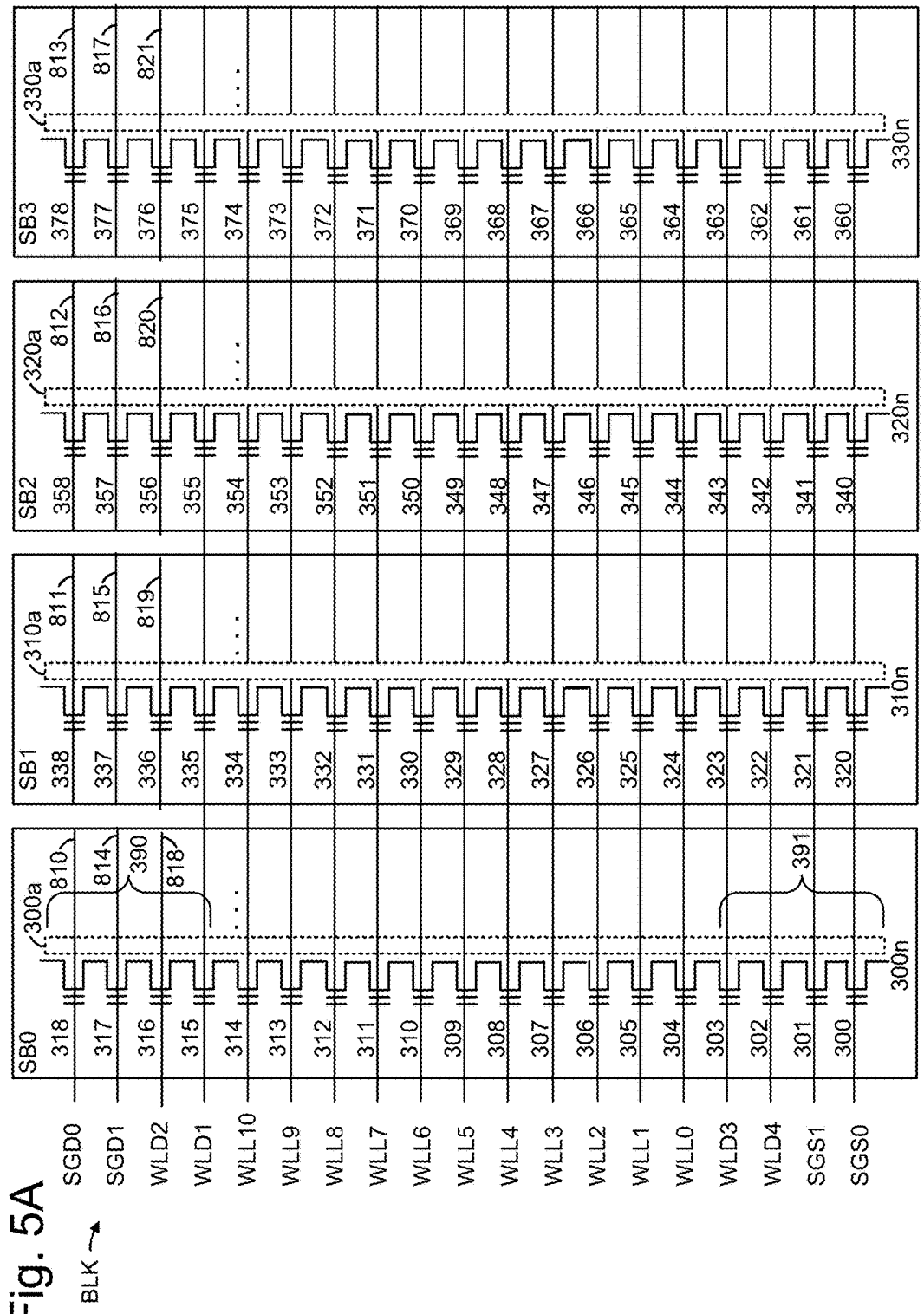
FIG. 5A depicts an example implementation of the memory structure 126 of FIG. 1A comprising NAND strings in sub-blocks in a 3D configuration.

FIG. 5A depicts an example implementation of the memory structure 126 of FIG. 1A comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 300n, 310n, 320n and 330n, respectively. The NAND strings have data word lines, dummy word lines and select gate lines. Each sub-block comprises a set of NAND strings which extend in the x direction and which have a common SGD line. SB0 has SGD lines or SGD layer portions 810 and 814 in the SGD0 and SGD1 layers, respectively. SB1 has SGD layer portions 811 and 815 in the SGD0 and SGD1 layers, respectively. SB2 has SGD layer portions 812 and 816 in the SGD0 and SGD1 layers, respectively. SB3 has SGD layer portions 813 and 817 in the SGD0 and SGD1 layers, respectively. Also, in this example, SB0, SB1, SB2 and SB3 have WLD2 layer portions 818, 819, 820 and 821, respectively. Thus, WLD2 has a separate portion for each sub-block. In contrast, the WLD1 layer is shared by all of the sub-blocks SB0 to SB3. Similarly, each of the data word line layers WLL0 to WLL10 and the SGS layers SGS0 and SGS1 is shared by all of the sub-blocks SB0 to SB3.

The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, the channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

Figure 5B:
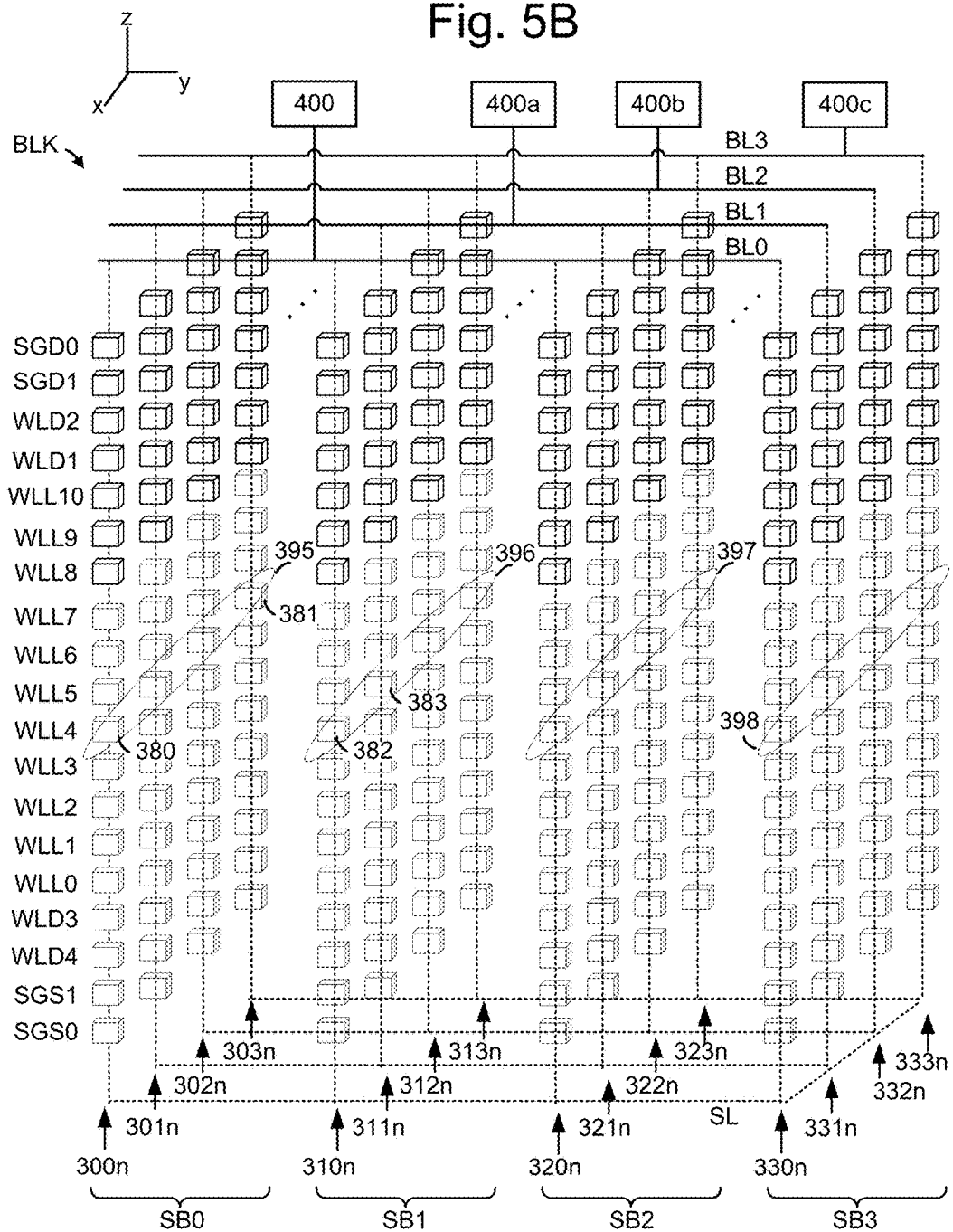
FIG. 5B depicts a perspective view of sub-blocks SB0-SB3 consistent with FIG. 5A.

FIG. 5B depicts a perspective view of sub-blocks SB0-SB3 consistent with FIG. 5A. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 300n, 301n, 302n and 303n. SB1 includes NAND strings 310n, 311n, 312n and 313n. SB2 includes NAND strings 320n, 321n, 322n and 323n. SB3 includes NAND strings 330n, 331n, 332n and 333n. Bit lines are connected to sets of NAND strings. For example, a bit line BL0 is connected to NAND strings 300n, 310n, 320n and 330n, a bit line BL1 is connected to NAND strings 301n, 311n, 321n and 331n, a bit line BL2 is connected to NAND strings 302n, 312n, 322n and 332n, and a bit line BL3 is connected to NAND strings 303n, 313n, 323n and 333n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line. For example, an example set 395 of memory cells in SB0 is connected to WLL4. Similarly, the sets 396, 397 and 398 comprise data memory cells in SB1, SB2 and SB3 are connected to WLL4.

As mentioned previously, disturbs can occur during programming and read operations. Different modes of disturbs can be defined. For example, an X mode disturb is experienced by a cell in the same sub-block but associated with a different bit line as a selected cell which is being programmed or read. An XY mode disturb is experienced by a cell in a different sub-block and associated with a different bit line than a selected cell which is being programmed or read. A Y mode disturb is experienced by a cell in a different sub-block but associated with a same bit line as a selected cell which is being programmed or read. The disturb can occur when a control gate voltage is applied to selected and unselected cells at a given word line layer/level in the stack.

For example, assume the cell 380 in SB0 is a selected cell. An unselected cell 381 in SB0 may experience X mode disturb, an unselected cell 382 in SB1 may experience Y mode disturb and an unselected cell 383 in SB1 may experience XY mode disturb. The disturb mode corresponds with the x-y-z axes of the Cartesian coordinate system depicted, where x is a SGD line direction, y is a bit line direction, and z is a vertical direction or a direction perpendicular to a plane of the substrate.

Figure 6A:
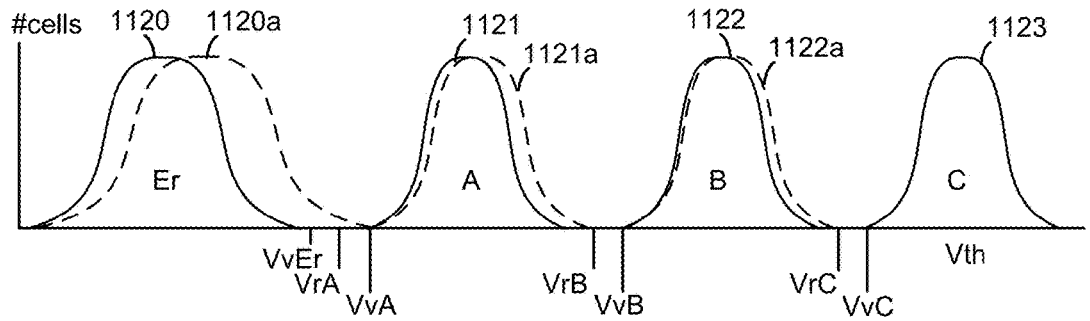
FIG. 6A depicts an example threshold voltage (Vth) distribution of a set of memory cells connected to a word line, showing the effects of program disturb, where four data states are used.

FIG. 6A depicts an example threshold voltage (Vth) distribution of a set of memory cells connected to a word line, showing the effects of program disturb, where four data states are used. For a set of cells which are programmed together, the Vth distributions 1120, 1121, 1122 and 1123 represent the erased (Er) state and programmed data states A, B and C, respectively, without program disturb. The Vth distributions 1120a, 1121a and 1122a represent the Er, A and B states, respectively, with program disturb. Program disturb generally affects the Er state cells primarily. When the upper tail of the Er state become higher than the read voltage VrA, Er-to-A state errors result. The error includes Er state cells which are read as being A state cells. Errors can result for other states as well. Disturbs which are caused by read operations can cause a similar problem.

In an erase operation, the erased state is reached when the Vth of the cells falls below a verify level VvEr. In a programming operation, the A, B and C states are reached when the Vth of the cells exceeds the verify level VvA, VvB or VvC, respectively. This example uses four data states. Other numbers of data states can be used as well, such as eight or sixteen. Read voltages VrA, VrB and VrC are used to read data from a set of cells having this Vth distribution.

In one approach, the memory cells store separate pages of data. For example, with four bits per cell as in this example, there will be a lower page and an upper page. The lower page is read using VrA and VrC and the upper page is read using VrB. An example encoding of bits for the Er, A, B and C states is 11, 10, 00 and 01, respectively, in the format of upper page (UP) bit/lower page (LP) bit.

Figure 6B:
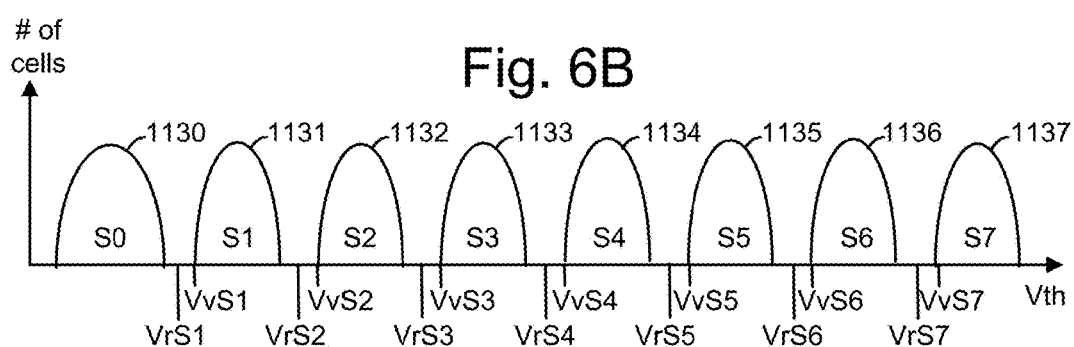
FIG. 6B depicts an example Vth distribution of memory cells, where eight data states are used.

FIG. 6B depicts an example Vth distribution of memory cells, where eight data states are used. The S0-S7 states have Vth distributions 1130-1137, respectively. For the S1-S7 states, we have verify voltages VvS1-VvS7, respectively, in one possible approach. For the S1-S7 states, we have read voltages VrS1-VrS7, respectively, and example encoding of bits of 111, 110, 100, 000, 010, 011, 001 and 101, respectively. The bit format is: UP/MP/LP. Read disturb is not depicted but can be similar to that shown in FIG. 6A where the lower programmed states and the erased state are most affected. In another example, sixteen data states are used.

Figure 7A:
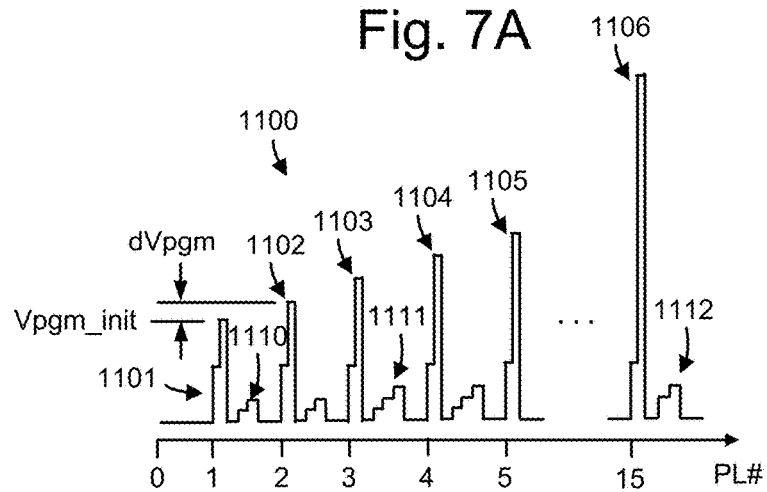
FIG. 7A depicts a waveform of an example programming operation comprising incremental step pulse programming.

FIG. 7A depicts a waveform of an example programming operation comprising incremental step pulse programming (ISPP). Vpgm_init is an initial program voltage and dVpgm is a step size. The horizontal axis depicts a program loop (PL) number and the vertical axis depicts control gate or word line voltage. Generally, a programming operation can involve applying a series of program voltage pulses to a selected word line, where the series includes multiple program loops or program-verify iterations. The program portion of the program-verify iteration comprises a program voltage, and the verify portion of the program-verify iteration comprises one or more verify voltages such as discussed in connection with FIG. 6A or 6B.

Each program voltage includes two steps, in one approach. Further, ISPP is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. The series of program voltages begins with an initial program voltage of Vpgm_init. Each successive program voltage may increase by a step size dVpgm. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After additional program loops, B- and C-state verify voltages of VvB and VvC (waveform 1112) may be applied after the final program voltage 1106.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines, including the unselected data word lines and the dummy word lines. By testing whether the Vth of a given memory cell is above or below one or more of the read voltages, the system can determine the data state which is represented by a memory cell. These read voltages are demarcation voltages because they demarcate between Vth ranges of different data states.

FIG. 7B depicts a plot of example waveforms in a read operation. A read operation may involve reading a number of pages of data—three pages in this example. A control gate read voltage is applied to a selected word line while a pass voltage, Vpass, is applied to the remaining unselected word lines. A sense circuit is then used to determine whether a cell is in a conductive state. Vpass is ramped up and then back down separately during the read voltages of each of the lower, middle and upper pages as depicted by plots 970, 971 and 972, respectively. This example is for an eight-state memory device, consistent with FIG. 6B. The example can be modified for fewer states (e.g., four states and two pages) or additional states (e.g., sixteen states and four pages).

For the first page, the S0 and S5 states are read using a read voltage waveform 970a having voltages of VrS0 and VrS5, respectively. For the second page, the S2, S4 and S6 states are read using a read voltage waveform 971a having voltages of VrS2, VrS4 and VrS6, respectively. For the third page, the S3 and S7 states are read using a read voltage waveform 972a having voltages of VrS3 and VrS7, respectively. Optionally, the bit line and/or source line can be charged up in a read operation.

FIG. 8A depicts a plot of Er-to-A state errors versus Vwld2, consistent with FIGS. 5A, 5B and 6A. The number of Er-to-A state errors can be measured by reading the cells using VrA as the control gate voltage and identifying the number of Er state cells with Vth>VrA, for instance. Vwld2 is the voltage on the WLD2, the dummy word line layer adjacent to the select gate layers. See FIG. 9. Using the techniques described herein, Vwld2 can be set separately for the selected and unselected sub-blocks. For instance, with a given value of Vwld2 on the selected sub-block, Vwld2 can be optimized and set differently for the unselected sub-blocks. The plot 1124 represents cells with X mode program disturb, which involves the selected sub-block (SB). In this case, the number of errors is lowest when Vwld2 is highest (e.g., V2). The plot 1125 represents cells with Y or XY modes program disturb which involve an unselected sub-block. In this case, the number of errors reaches a minimum when Vwld2=V1 (<V2) and then increases. Accordingly, by providing separate dummy word line layer portions for WLD2, the portion associated with the selected sub-block can be driven at the optimal level of V2 while the portions associated with unselected sub-blocks can be driven at the optimal level of V1, where optimal means having the minimum number of errors, for instance.

The plots 1124 and 1125 converge for Vwld2 less than about V1.

A plot similar to that of FIG. 8A was obtained for memory devices with different dimensions. It was found that the number of read errors is significantly higher for smaller dimension (more scaled) devices. Accordingly, the techniques described herein will become even more important as device dimensions are scaled down. See also FIG. 8B to 8D for further details regarding the disturb modes.

FIG. 8B depicts a plot of a number of cells experiencing X mode (same sub-block, different bit line) program disturb versus Vwld2 for three different levels of Vwld1. Plots 900, 901 and 902 represent Vwld1=7, 8 or 9 V, respectively. For lower levels of Vwld2, below a voltage which is denoted by a vertical arrow, the number of errors is higher when Vwld1 is higher. For higher levels of Vwld2, the number of errors becomes equally low for the different levels of Vwld1.

FIG. 8C depicts a plot of a number of cells experiencing XY mode (different sub-block, different bit line) program disturb versus Vwld2 for three different levels of Vwld1. Plots 903, 904 and 905 represent Vwld1=7, 8 or 9 V, respectively. For lower levels of Vwld2, below a voltage which is denoted by the arrow "a", the number of errors is higher when Vwld1 is higher. As Vwld2 increases to an optimal level (above the arrow "a" and below the arrow "b"), the number of errors becomes equally and optimally low for the different levels of Vwld1. As Vwld2 increases further to a voltage above the arrow "b," the number of errors becomes slightly higher, where higher levels of Vwld1 are associated with a lower number of errors.

FIG. 8D depicts a plot of a number of cells experiencing Y mode (different sub-block, same bit line) program disturb versus Vwld2 for three different levels of Vwld1. Plots 906, 907 and 908 represent Vwld1=7, 8 or 9 V, respectively. For lower levels of Vwld2, below a voltage which is denoted by the arrow "c", the number of errors is higher when Vwld1 is higher. As Vwld2 increases to an optimal level (above the arrow "c" and below the arrow "d"), the number of errors becomes equally and optimally low for the different levels of Vwld1. As Vwld2 increases further to a voltage above the arrow "d," the number of errors becomes significantly higher, where higher levels of Vwld1 are associated with a lower number of errors.

FIG. 8B to 8D show that the optimal combinations of dummy word line voltages Vwld1 and Vwld2 for minimizing disturbs can vary based on the disturb mode. Moreover, an optimal range of Vwld2 which minimizes errors varies based on the disturb mode. The optimal dummy word line voltages can be determine from testing and experimentation. Specific disturb modes made be more prevalent than others in a given memory device. The techniques provided herein allow one or more dummy word line voltages to be set differently for selected and unselected sub-blocks, to minimize disturbs.

Figure 9:
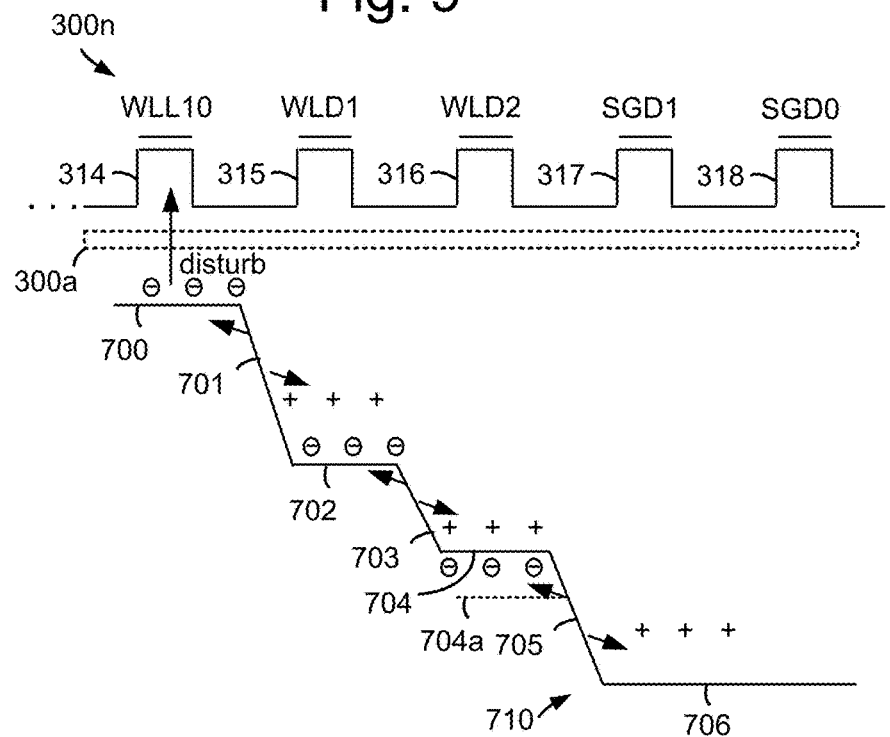
FIG. 9 depicts a plot of channel voltage in an unselected memory string in an unselected sub-block, showing channel gradients which cause disturbs of the drain-side data word line WLL10.

FIG. 9 depicts a plot of channel voltage in an unselected memory string in an unselected sub-block, showing channel gradients which cause disturbs of the drain-side data word line WLL10. When memory cells of the drain side edge word line are programmed, electrons are generated from the SGD transistors due to gate-induced drain leakage (GIDL). These electrons can cause program disturb on the memory cells. To reduce program disturb, a number of dummy word lines can be provided between the SGD transistors and the edge data word line. This reduces the electric field in the region and suppresses electron-hole pair generation. By optimally selecting the voltages on the dummy word lines, sharp transitions in the electric field can be avoided and program disturb can be reduced. However, the optimal dummy word line voltage for reducing program disturb on a selected sub-block is different than the optimal dummy word line voltage for reducing program disturb on unselected sub-blocks.

When a common dummy word line layer is used in different sub-blocks, it difficult to choose a best bias setting to minimize program disturb because the optimal bias settings for the inhibit erased state cells on the selected sub-block are not the best for the inhibited erased state cells in unselected sub-blocks, and vice-versa. The techniques provided herein address this problem by providing separate dummy word line layer portions for the different sub-blocks. Each separate dummy word line layer portion can be independently driven by a respective voltage. Moreover, there is a recognition that the separate dummy word line layer portions need not be provided for all dummy word line layers. Instead, the separate portions can be provided for the topmost dummy word line layer, which is adjacent to the SGD transistors. Each of one or more dummy word line layers can continue to be a layer having only one single layer portion (a single dummy word line) which is shared by all sub-bocks, in one approach, while, separating portions (separating dummy word line layers) in other dummy word line layers.

A portion of the memory string 300n and its channel 300a of FIG. 5A is depicted. The memory string 300n includes the data memory cell 314 connected to WLL10, the dummy memory cells 315 and 316 connected to WLD1 and WLD2, respectively, and the SGD transistors 317 and 318 connected to SGD1 and SGD0, respectively. A plot 710 represents a voltage along the length of the channel. A higher level of the plot represents a higher voltage. Moreover, each portion of the plot is directly under a corresponding portion of the channel, and the level of each plot portion represents the level of the corresponding portion of the channel. For example, plot portions 700, 702, 704 and 706 represent voltages of channel portions for cells 314, 315 and 316 and SGD transistors 317/318, respectively. Plot portions 701, 703 and 705 represent changes or gradients in channel voltages. The SGD transistors are driven separately in each sub-block.

For example, assume SB1 is the selected sub-block for a programming operation involving cells connected to WLL10. The control gates of the SGD transistors in the selected sub-block will receive a positive voltage, e.g., 2.5 V, while the SGD transistors in the unselected sub-blocks SB0, SB2 and SB3 typically receive 0 V. Each memory string in the selected sub-block is connected to a respective bit line via its one or more SGD transistors, so that the respective bit line can be set to 0 V to allow programming in the string by providing the one or more SGD transistors in a conductive state, or 2.5 V to prevent programming in the string by providing the one or more SGD transistors in a non-conductive state, during a program voltage. For the unselected sub-blocks, programming is prevented for all memory strings since the SGD transistors in a non-conductive state.

The plot portion 706 may represent −2.5 V when Vsgd1 and Vsgd0 are 0 V and the Vth of the SGD transistors 317 and 318 is 2.5 V. The channel voltage under a transistor is approximated by the control gate voltage minus the Vth of the transistor. The plot portion 704 may represent 4 V when Vwld2 is 4 V and the Vth of the WLD2 transistor 316 is 0 V. The plot portion 702 may represent 8 V when Vwld1 is 8 V (Vpass) and the Vth of the WLD1 transistor 315 is 0 V. The plot portion 700 may represent up to about 10-20 V due to the application of a program voltage Vpgm (e.g., 15-25 V) to the memory cell 314 and the Vth which might be in the range of 0-5 V.

Due to the different channel voltages, the channel gradients are formed. The channel gradients generate electron-hole pairs in the channel. The electrons can be accelerated and injected into the charge trapping layer of the drain-side data memory cell 314 (as represented by the vertical arrow), causing a disturb. Example electrons are denoted by "−" in a circle and holes are denoted by "+". This disturb programs the memory cell 314, thus increasing its Vth. Moreover, the electrons which are generated at the drain-edge of the channel, under the SGD transistors, can travel to the memory cell 314 and cause a disturb. The voltages on the dummy word lines can control the channel gradients between the SGD transistors and the memory cell 314. Since a larger gradient is associated with a greater amount of electron-hole pair generation, the voltages on the dummy word line portions can be set to reduce the channel gradients between the SGD transistors and the memory cell 314. The techniques provided herein allow this control of the voltages on the dummy word line portions in the unselected sub-blocks independent of the voltages on the dummy word line portions in the selected sub-block.

For example, the plot 704a shows a reduced channel voltage which is obtained by reducing Vwld2, the channel voltage under WLD2. This in turn reduces the channel gradient depicted by plot 705. Thus, in one example, Vwld2 for the unselected sub-blocks is lower than Vwld2 for the selected sub-block. Vwld1 could also be adjusted separately, e.g., higher or lower than for the selected sub-block, for the unselected sub-blocks in some embodiments. In some cases, additional dummy memory cells and/or SGD transistors can be provided as well in each memory string. It is also possible to have just one SGD transistor in a memory string.

FIG. 10A depicts an example cross-sectional view of a block BLK0 of memory cells where each dummy word line layer is shared among all sub-blocks. The block comprises a plurality of control gate layers spaced apart vertically and separated by dielectric layers (not depicted). The block includes local interconnects (LI) 800, 802 and 805. The LIs 800 and 805 are at edges of the block and the LI 802 is in the middle of the block. Additionally, isolation regions 801 and 803 are depicted. Each of the sub-blocks SB0 to SB3 has separate SGD layer portions. For example, SB0-SB3 have SGD layer portions 810-813, respectively, in the SGD layer of SGD0, and SGD layer portions 814-817, respectively, in the SGD layer of SGD1. The SGD layer portions in SB0 are separated from the SGD layer portions in SB1 by the IR 801, the SGD layer portions in SB1 are separated from the SGD layer portions in SB2 by the LI 802, and the SGD layer portions in SB2 are separated from the SGD layer portions in SB3 by the IR 803.

Each dummy word line layer and data word line layer is shared across all sub-blocks and may include two connected portions. Each SGS layer may also be shared across all sub-blocks and may include two connected portions, in one approach. The horizontal arrows denote a connection between two word line layer or SGS layer portions. For example, WLD2 includes portions 818*a* and 818*b*, WLD1 includes portions 822*a* and 822*b*, WLL10 includes portions 823*a* and 823*b*, WLL9 includes portions 824*a* and 824*b*, WLL8 includes portions 825*a* and 825*b*, WLL7 includes portions 826*a* and 826*b*, WLL6 includes portions 827*a* and 827*b*, WLL5 includes portions 828*a* and 828*b*, WLL4 includes portions 829*a* and 829*b*, WLL3 includes portions 830*a* and 830*b*, WLL2 includes portions 831*a* and 831*b*, WLL1 includes portions 832*a* and 832*b*, WLL0 includes portions 833*a* and 833*b*, WLD3 includes portions 834*a* and 834*b*, WLD4 includes portions 835*a* and 835*b*, SGS1 includes portions 836*a* and 836*b*, and SGS0 includes portions 837*a* and 837*b*.

Since the dummy word line layers are shared by all sub-blocks in the block, there is no ability to provide different voltages for selected and unselected sub-blocks. Program and read disturbs therefore cannot be reduced in this configuration.

Note that the thickness or height of the select gate layer and word line layers is uniform in this example. In other cases, the layers can have different heights.

Generally, a block can comprise one or more regions of control gate word line layers between two or more local interconnects. Note that a metal interconnect can be replaced by an isolation region (e.g., insulation such as oxide with no metal) if it is not desired to have a conductive path through the stack.

SB0 and SB1 are provided in a region 860 of the stack, while SB2 and SB3 are provided in a region 861 of the stack.

The isolation regions tend to be thinner than the LIs because they do not extend to the bottom of the stack. The dummy word line layers can be separated by extending the isolation regions, which are used to separate the SGD layers, further down in the stack.

FIG. 10B depicts an example perspective view of a portion of the block BLK0 of FIG. 10A. The portion includes the top two data word line layers, WLL9 and WLL10, two dummy word line layers, WLD1 and WLD2, and two SGD layers, SGD1 and SGD2. The data word line layers and WLD1 extend as continuous plates across the block. WLD2 also extends across the block but has a slit 802*a* at the location of the LI 802 in FIG. 10B. However, the slit does not separate WLD2 into independent portions because of an end region 818*c* which extends past the SGD layers in the x-direction. The SGD layers include separate portions as depicted in FIG. 10A.

Figure 18:
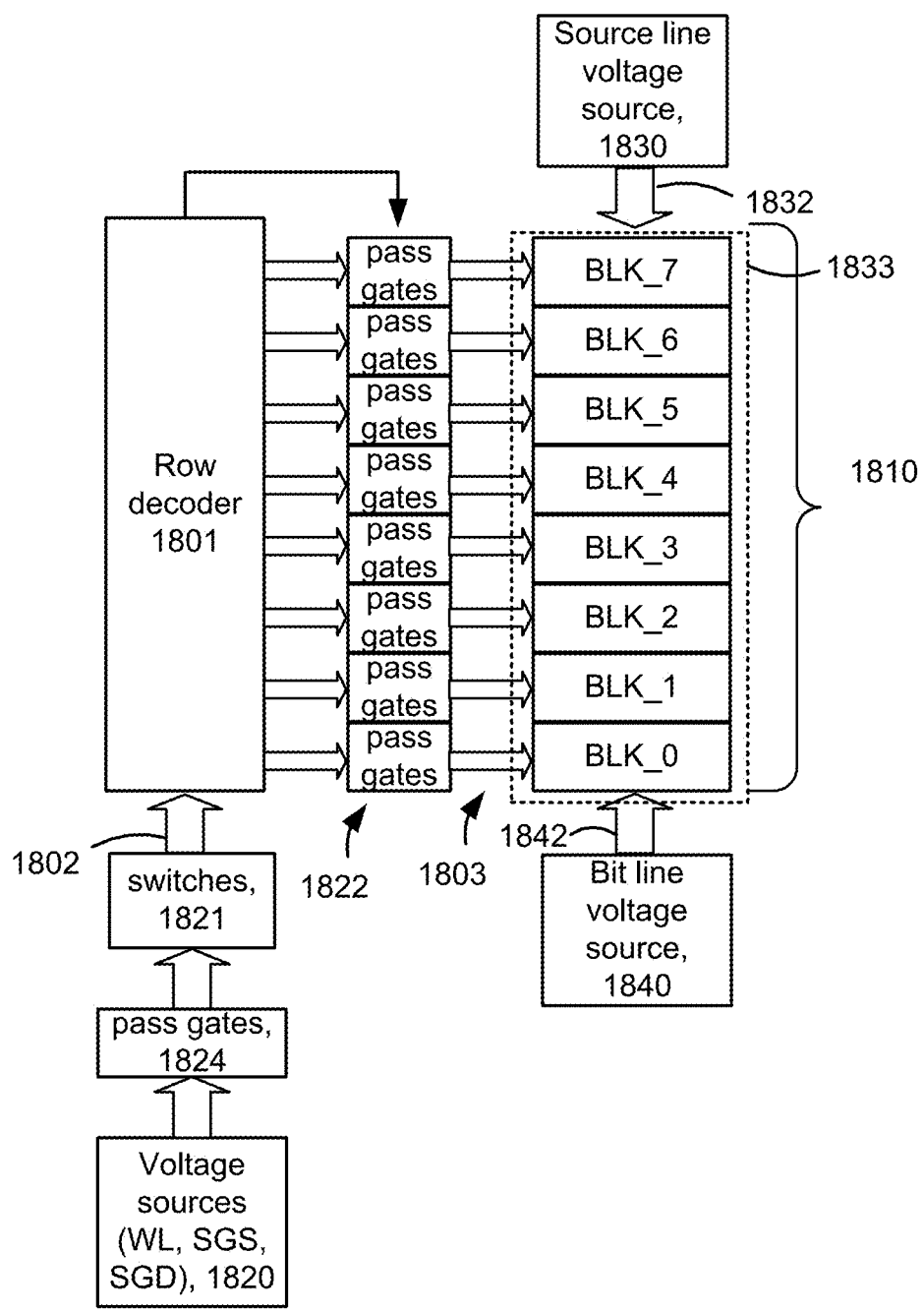
FIG. 18 depicts an example circuit for providing voltages to blocks of memory cells.

Contacts in the form of pillars are connected to the different layers and layer portions. The contacts may extend upward above the stack to a metallization layer in which conductive paths are formed to connect the different layers and layer portions to voltage drivers such as depicted in FIG. 18. For example, contacts 1013, 1012, 1011 and 1010 are connected to WLL9, WLL10, WLD1 and WLD2, respectively. Contacts 1004-1007 are connected to SGD layer portions 814-817, respectively. Contacts 1000-1003 are connected to SGD layer portions 810-813, respectively. The contacts are connected to a top surface of a layer or layer portion in a terrace structure, in this example. See also FIG. 15. The WLD1, WLL10 and WLL9 layers are depicted by layers 1020, 1021 and 1022, respectively.

The four rows of circles in each portion of the SGD0 layer represent memory holes or strings.

Figure 10C:
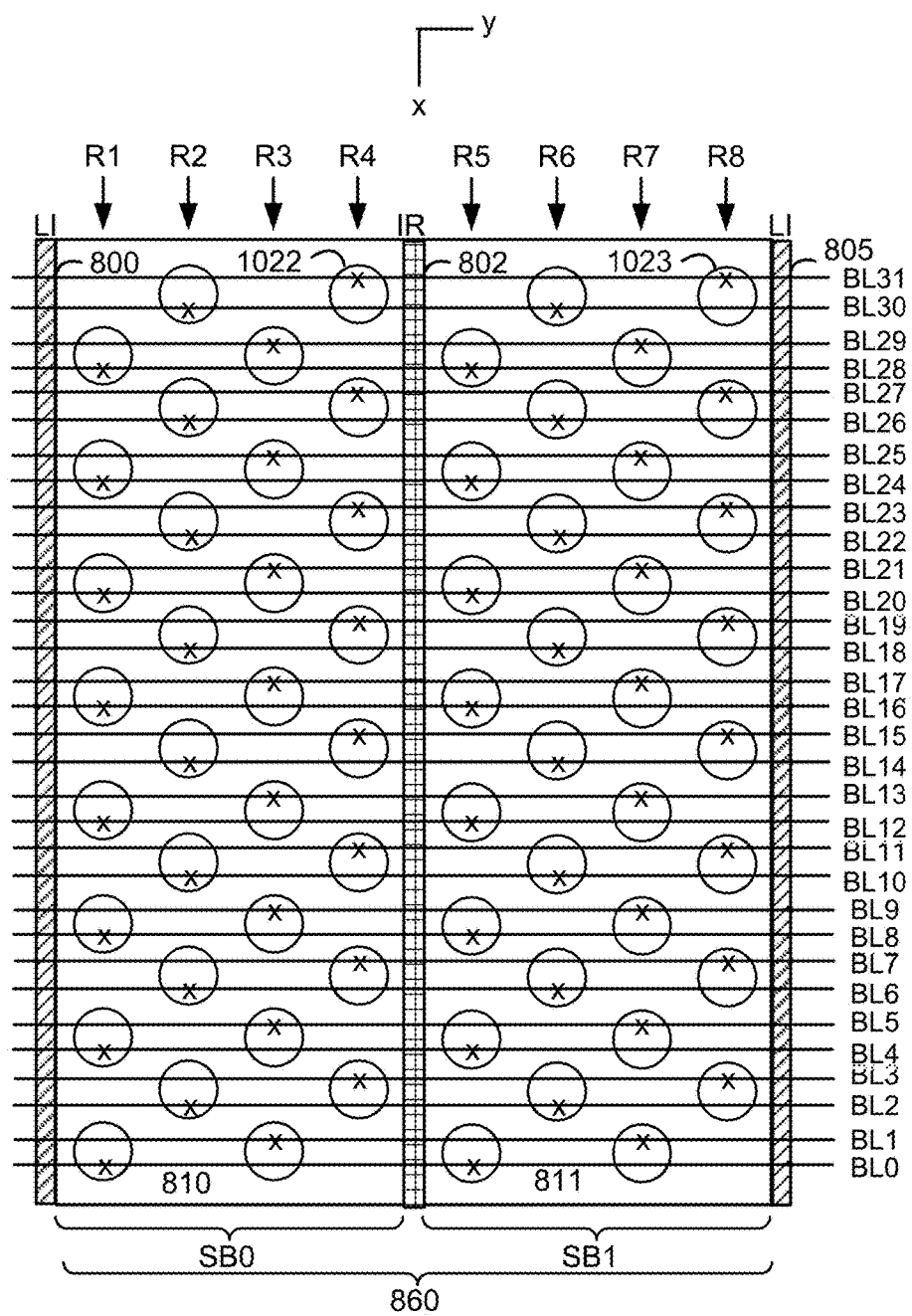
FIG. 10C depicts an example top view of the region 860 of the block BLK0 of FIG. 10A.

FIG. 10C depicts an example top view of the region 860 of the block BLK0 of FIG. 10A. This region is one half of a block. The SGD layer portions 810 and 811 have a number of memory holes or strings passing through them. A number of bit lines BL0 to BL31 extend above the memory holes, across the top of the stack. Each circle represents the cross-section of a memory hole or string. Each bit line is connected to one memory hole or string in each sub-block as indicated by the "X" symbols. For example, BL31 is connected to memory holes or strings 1022 and 1023 in SB0 and SB1, respectively. Also, the memory strings are arranged in rows R1-R8 which extend in the x-direction, and adjacent rows are staggered to improve the memory hole density. While FIG. 10A depicts eight rows of memory holes between adjacent local interconnects, this is an example. Future devices may have more rows, such as sixteen rows. In practice, the sub-blocks are elongated in the x direction and contain thousands of memory strings.

FIG. 11A depicts an example cross-sectional view of a block BLK0 of memory cells where portions of the dummy word line layer WLD2 are separate for each sub-block and the dummy word line layer WLD1 is shared among all sub-blocks. In particular, the independent WLD2 portions 818, 819, 820 and 821 are in sub-blocks SB0, SB1, SB2 and SB3, respectively. The remaining layer portions are the same as in FIG. 10A. Since the dummy word line layers of WLD2 are separate for each sub-block, they can be driven with different voltages for selected and unselected sub-blocks. Program and read disturbs therefore can be reduced in this configuration by setting the WLD2 voltages optimally for selected and unselected sub-blocks. In one approach, the WLD2 portions for all of the unselected sub-blocks receive the same voltage while the WLD2 portion for the selected sub-block receives another voltage.

FIG. 11B depicts an example perspective view of a portion of the block BLK0 of FIG. 11A. The structure is similar to that in FIG. 10B except the WLD2 layer includes separate portions 818, 819, 820, 821 connected to respective contacts 1015, 1016, 1017 and 1018. The separate portions are not electrically connected to one another and therefore can be driven with separate voltages, in one approach.

This is an example of a dummy word line layer WLD2 of a set of dummy word line layers (WLD1 and WLD2) comprising N (=4) separate portions, where N is an integer of two or more. WLD2 is a topmost dummy word line layer of the set of dummy word line layers. Further, WLD1 is another dummy word line layer of the set of dummy word line layers which is below the topmost dummy word line layer and comprises fewer portions (e.g., 1) than the N separate portions. The another dummy word line layer thus comprises a single portion which is common to the plurality of sub-blocks SB0-SB4.

FIG. 11C depicts an example perspective view of a portion of the block BLK0 of FIG. 11A with a modification in which one portion of the dummy word line layer WLD1 is shared by sub-blocks SB0 and SB1 and another portion of the dummy word line layer WLD1 is shared by sub-blocks SB1 and SB2. This structure is obtained by modifying the structure of FIG. 11A to provide WLD2 in two separate, unconnected portions 822a and 822b having contacts 1011a and 1011b, respectively. This approach provides greater control of the WLD1 layer even if separate portions are not provided for each sub-block. For example, assume SB0 is a selected sub-block for a programming operation. The WLD1 portion 822a which is common to SB0 and SB1 will be driven at one voltage. As a result, the program disturb for SB1 cannot be optimized through control of the WLD1 layer separately in SB0 and SB1. However, the WLD2 portions are separate for each sub-block so that program disturb for SB1 can be optimized through control of the associated WLD2 layer portion 819.

On the other hand, the WLD1 portion 822b which is common to SB2 and SB3 is separate from the WLD1 portion 822a. As a result, for SB2 and SB3, the program disturb can be further optimized through control of the WLD1 layer portion 822b in addition to the optimization provided by the associated WLD2 portions 820 and 821. This approach represents an example of a tradeoff between the disturb-fighting benefit of separate voltage control of each dummy word line layer for each sub-block, and the additional cost of circuitry and wiring which provides the separate control, and an additional cost and complexity. For example, the fabrication process can become more difficult because the distance between adjacent sub-blocks can be small and it can be challenging to separate the dummy word line layers between the sub-blocks. Additionally, each dummy word line portion may require a separate hook-up and decoding circuitry and this will increase the total hook-up circuitry area and complexity. Considering these factors, providing separate connections for one or more, but fewer than all, SGD dummy word line layers can be a good compromise.

The dummy word line separation scheme can be different for each individual dummy word line layer. Typically, higher dummy word line layers (closer to the SGD layers) are easier to separate between sub-blocks than lower dummy word line layers.

In this example, a dummy word line layer WLD2 of a set of dummy word line layers (WLD1 and WLD2) comprises N (=4) separate portions, where N is an integer of two or more. The dummy word line layer WLD2 is a topmost dummy word line layer of the set of dummy word line layers. Further, WLD1 is another dummy word line layer of the set of dummy word line layers which is below the topmost dummy word line layer and comprises fewer portions (e.g., 2) than the N separate portions.

Figure 12A:
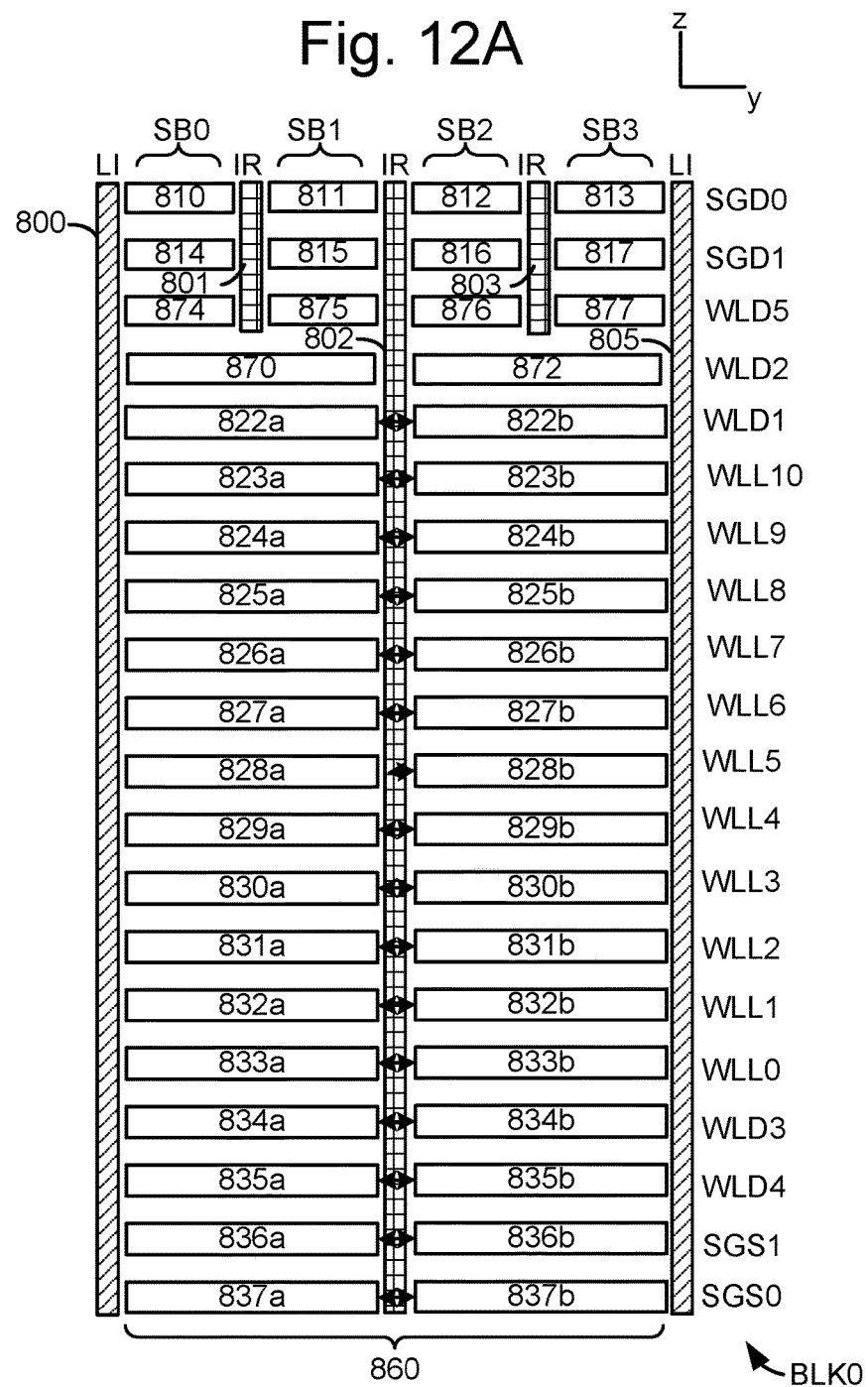
FIG. 12A depicts an example cross-sectional view of a block BLK0 of memory cells where portions of the dummy word line layer WLD5 are separate for each sub-block, one portion of the dummy word line layer WLD2 is shared by sub-blocks SB0 and SB1 and another portion of the dummy word line layer WLD2 is shared by sub-blocks SB1 and SB2, and the dummy word line layer WLD1 is shared among all sub-blocks.

FIG. 12A depicts an example cross-sectional view of a block BLK0 of memory cells where portions 874-877 of the dummy word line layer WLD5 are separate for each sub-block SB0-SB3, respectively, one portion 870 of the dummy word line layer WLD2 is shared by sub-blocks SB0 and SB1 and another portion 872 of the dummy word line layer WLD2 is shared by sub-blocks SB1 and SB2, and the dummy word line layer WLD1 is shared among all sub-blocks. This example adds a third drain-side dummy word line layer WLD5 compared to FIGS. 10A and 11A. As in FIG. 11A, the topmost dummy word line layer (WLD5) has separate portions for each sub-block so that voltages on the unselected WLD5 portions can be optimized relative to voltages on the selected WLD5 portion to reduce disturbs. Additionally, voltages can be optimized to some extent on the two portions of WLD2 in a tradeoff similar to what was discussed in connection with FIG. 11C. Further, in this example, the voltages cannot be optimized on WLD1 for selected and unselected sub-blocks separately since this layer is common to all sub-blocks.

Figure 12B:
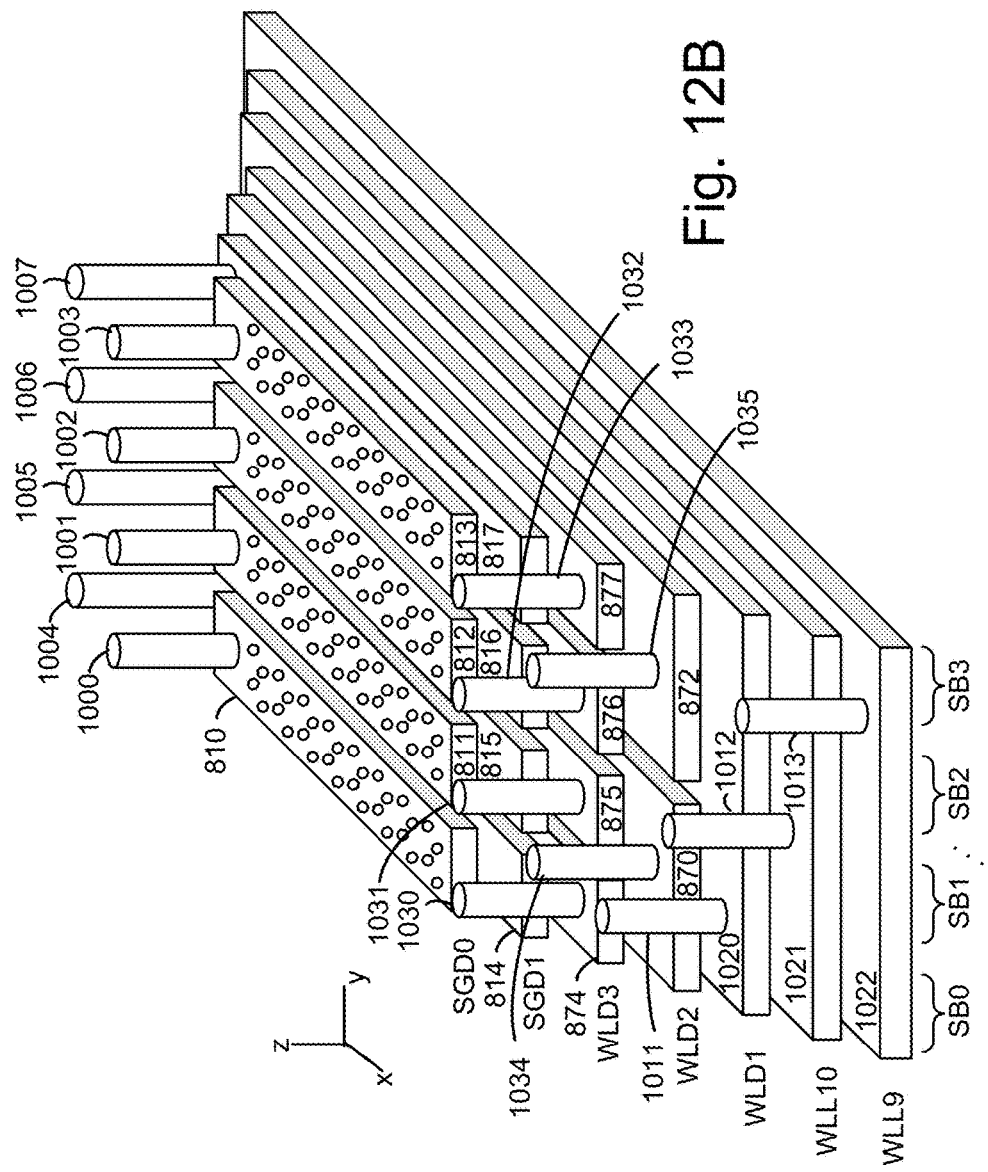
FIG. 12B depicts an example perspective view of a portion of the block BLK0 of FIG. 12A.

FIG. 12B depicts an example perspective view of a portion of the block BLK0 of FIG. 12A. The WLD5 layer includes the portions 874-877 with respective contacts 1030-1033. The WLD2 layer includes the portions 870 and 872 with respective contacts 1034 and 1035. The WLD1, WLL10 and WLL9 layers 1020, 1021 and 1022 include the respective contacts 1011, 1012 and 1013, as discussed in connection with FIG. 10B.

Figure 13A:
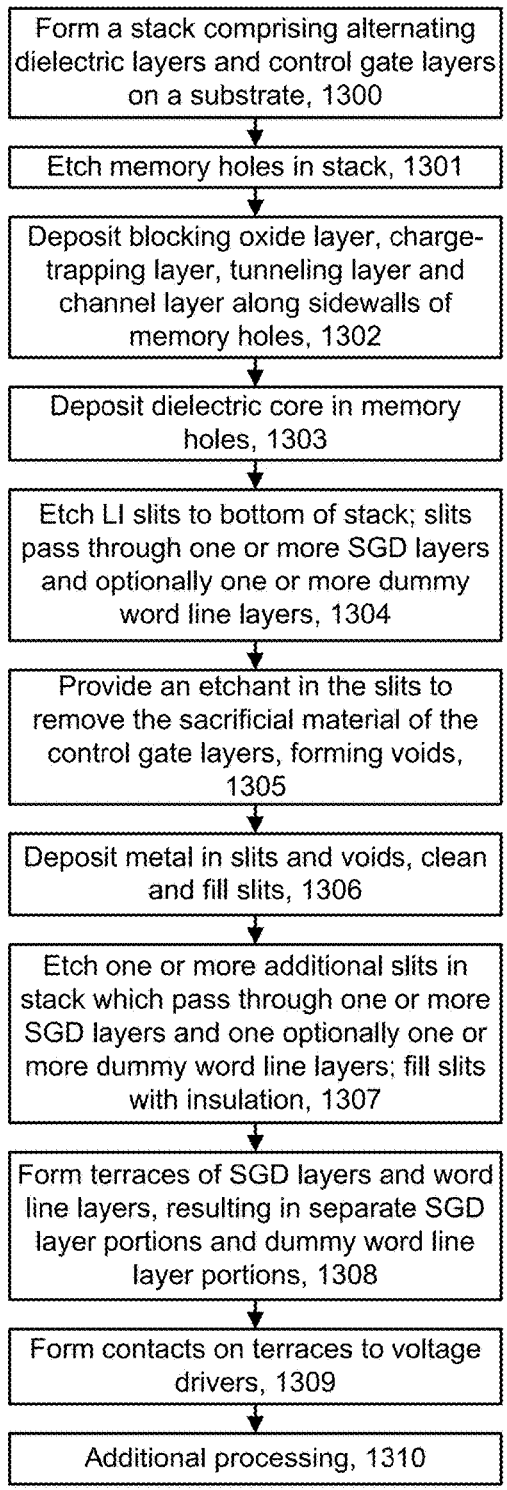
FIG. 13A depicts an example process for forming a memory device in which different dummy word line layers are configured differently.

FIG. 13A depicts an example process for forming a memory device in which different dummy word line layers are configured differently. Step 1300 includes forming a stack comprising alternating dielectric layers and control gate layers on a substrate. In one approach, the control gate layers initially comprise a sacrificial material such as $Si_3N_4$. See, e.g., FIG. 14A. Step 1301 includes etching memory holes in the stack. See, e.g., FIG. 14B. Step 1302 includes depositing, in turn, a blocking oxide layer, a charge-trapping layer, a tunneling layer and a channel layer along the sidewalls of the memory holes. See, e.g., FIG. 14B. For example, chemical vapor deposition (CVD) may be used to deposit these layers. In one approach, the channel layer is formed by depositing amorphous silicon and this is converted to polysilicon through subsequent heating steps.

Step 1303 includes depositing a dielectric core such as SiO2 in each of the memory holes. See FIG. 14B. Step 1304 includes etching LI slits to the bottom of the stack, where the slits pass through one or more SGD layers and optionally one or more dummy word line layers. See FIG. 14C. Step 1305 includes providing an etchant in the slit to remove the sacrificial material of the control gate layers, thus forming voids in the control gate layers. See FIG. 14D. The sacrificial material may comprise Si3N4 and the dielectric layers may comprise oxide, for example. The etchant can be a wet or dry etchant which is more selective of the sacrificial material of the control gate layer than of the dielectric layers. Step 1307 includes etching one or more additional slits in the stack which pass through one or more SGD layers and optionally one or more dummy word line layers, and filling the slits with insulation. See FIG. 14G. Step 1308 includes forming terraces of SGD layers and word line layers, resulting in separate SGD layer portions and dummy word line layer portions. See FIG. 15. Step 1309 includes forming contacts on the terraces to voltage drivers. See FIGS. 10B, 11B, 11C and 12B. Step 1310 includes additional processing such as forming bit lines and other structures above the stack.

Note that the steps depicted can be performed in different orders in different implementations.

Figure 13B:
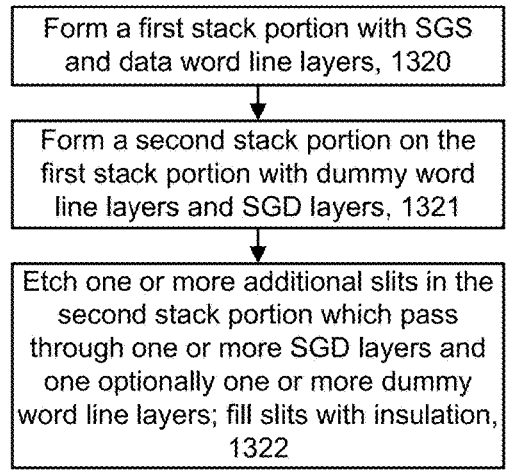
FIG. 13B depicts an example process for forming a memory device in which a second stack portion comprising dummy word line layers and SGD layers is formed on a first stack portion comprising data word line layers and SGS layers.

FIG. 13B depicts an example process for forming a memory device in which a second stack portion comprising dummy word line layers and SGD layers is formed on a first stack portion comprising data word line layers and SGS layers. See FIG. 16A to 16C. Step 1320 includes forming a first stack portion with SGS and data word line layers. The process of FIG. 13A is performed except the layers are not included for the dummy word line layers and SGD layers. Step 1321 includes forming a second stack portion on the first stack portion with dummy word line layers and SGD layers. The process of FIG. 13A is performed with the dummy word line layers and SGD layers. Step 1322 includes etching one or more additional slits in the second stack portion which pass through one or more SGD layers and optionally one or more dummy word line layers, and filling the slits with insulation. This forms the isolation regions.

Figure 13C:
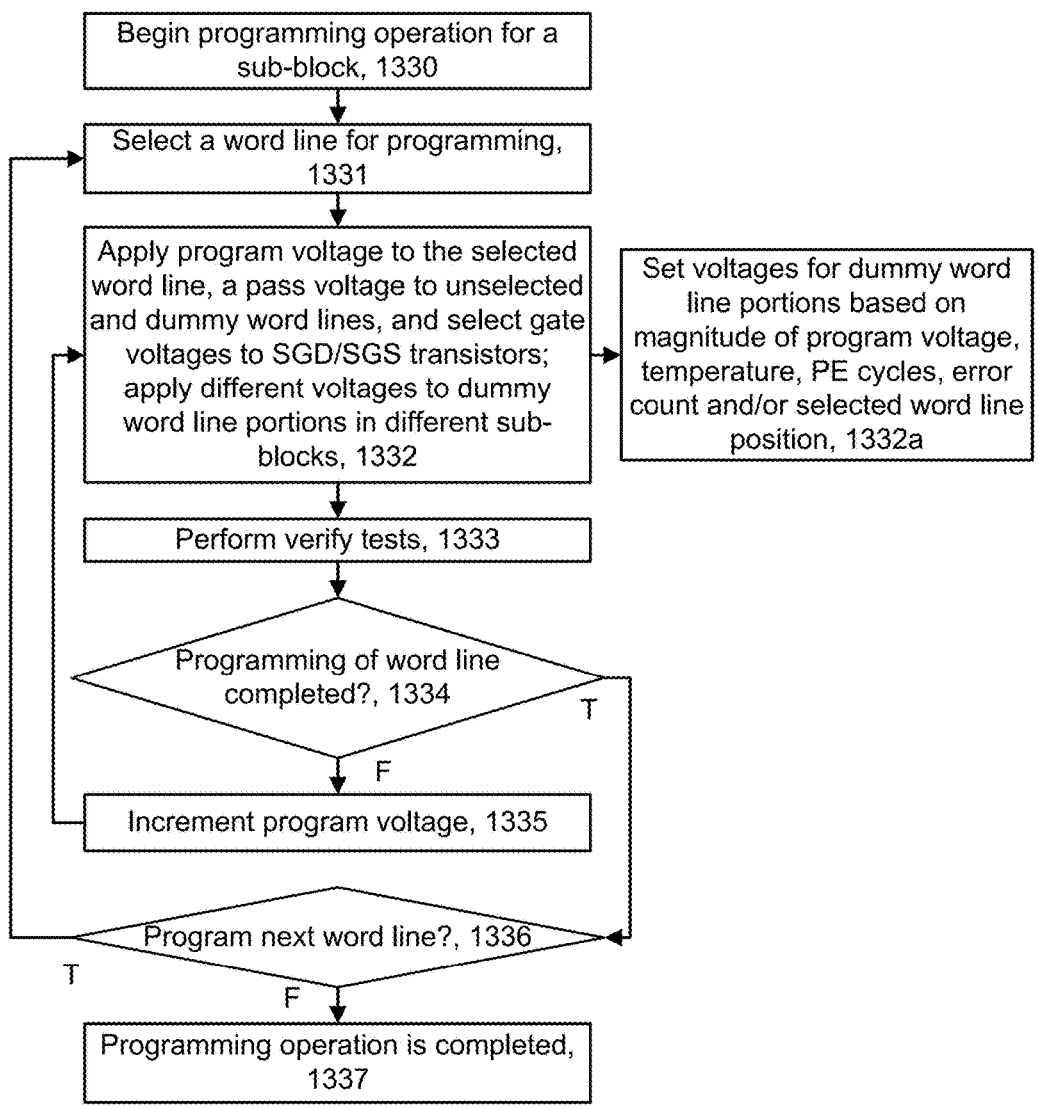
FIG. 13C depicts an example process for programming cells in a sub-block.

FIG. 13C depicts an example process for programming cells in a sub-block. Step 1330 begins a programming operation for a sub-block. Step 1331 selects a word line for programming. Step 1332 includes applying a program voltage to the selected word line, a pass voltage to unselected and dummy word lines, and select gate voltages to SGD/SGS transistors. The step also includes applying different voltages to different dummy word line portions in different sub-blocks, as discussed previously. The voltages for the dummy word line portions can be based on various factors. Generally, testing can be used to determine the optimal voltages which minimize errors based on one or more factors. The factors can include the magnitude of the program voltage, a detected temperature in the memory device, a number of PE cycles of the block or sub-block, an error count from a past read operation in the block or sub-block and a position of the selected word line. Step 1332a thus includes setting voltages for the dummy word line portions based on the magnitude of the program voltage, a detected temperature in the memory device, a number of PE cycles of the block or sub-block, an error count from a past read operation in the block or sub-block and/or a position of the selected word line.

In step 1332, in addition to setting the level of a voltage for a dummy word line portion, it is possible to adjust a ramp up rate of a voltage for a dummy word line portion. The channel gradients which contribute to disturbs can be controlled by making a ramp up rate of a voltage on a selected dummy word line layer portion of a selected sub-block different than a ramp up rate of a voltage on unselected dummy word line layer portions of unselected sub-blocks. For instance, in FIG. 9, it was mentioned that Vwld2 for the selected dummy word line layer portion can be set to the level of plot 704 while Vwld2 for the unselected dummy word line layer portion can be set to the lower level of plot 704a. Another option is to provide the ramp up to the level of plot 704a at a different rate than the ramp up to the level of plot 704. Experimentation can indicate whether a higher or lower ramp up rate for the unselected dummy word line layer portion reduces disturbs.

Regarding the magnitude of the program voltage (Vpgm) which may correspond with the program loop number when ISPP is used, a higher Vpgm can increase the likelihood of program disturb of the drain-side edge word line. For example, a higher Vpgm is more likely to attract electrons into the charge trapping layer of the memory cell. A higher Vpgm also results in a higher channel gradient and increased electron-hole generation. Accordingly, one approach is to adjust the voltage of the dummy word line portions of the unselected blocks to provide a relatively smaller gradient between SGD1 and WLD2, for instance, when Vpgm is relatively larger. This can involve providing a relatively lower voltage on the unselected dummy word line layer portions when Vpgm is relatively higher.

Regarding the temperature, the likelihood of a disturb is higher when the temperature is higher due to increased electron-hole generation in the channel and increased electron mobility. Accordingly, one approach is to adjust the voltage of the dummy word line portions of the unselected blocks to provide a relatively smaller gradient between SGD1 and WLD2, for instance, when the temperature is relatively higher. This can involve providing a relatively lower voltage on the unselected dummy word line layer portions when a temperature is relatively higher. For example, Vsgd1 can be made relatively lower.

Regarding the number of PE cycles of the block or sub-block, a higher number of cycles may be associated with a greater likelihood of a disturb. Cells become easier to program (or disturb) as PE cycles increase due to degradation of the cell. Accordingly, one approach is to adjust the voltage of the dummy word line portions of the unselected blocks to provide a relatively smaller gradient between SGD1 and WLD2, for instance, when the number of PE cycles is relatively higher. For example, the unselected dummy word line layer portions such as Vsgd1 can be made relatively lower.

Regarding the error count of the block or sub-block, a higher number of errors may be an indicator of a disturb. Accordingly, one approach is to adjust the voltage of the dummy word line portions of the unselected blocks to provide a relatively smaller gradient between SGD1 and WLD2, for instance, when the number of error count is relatively higher. For example, the unselected dummy word line layer portions such as Vsgd1 can be made relatively lower.

Regarding the position of the selected word line, a disturb is more likely when the selected word line is the drain-side data word line, e.g., the topmost data word line. This is because the drain-side data word line is closest among the data word lines to the SGD transistors which generates electrons due to GIDL. The drain-side data word line is also closest to the region of the string where the largest channel gradients exist. Accordingly, one approach is to adjust the voltage of the dummy word line portions of the unselected blocks to provide a relatively smaller gradient between SGD1 and WLD2, for instance, when the selected word line is the drain-side data word line than when the selected word line is not the drain-side data word line. For example, the unselected dummy word line layer portions such as Vsgd1 can be made relatively lower. Another approach is to make this adjustment when the selected word line is among a set of multiple drain-side data word lines.

Step 1333 involves performing verify tests, e.g., by applying verify voltages such as depicted in FIG. 7A. A decision step 1334 determines if programming of the selected word line is completed, e.g., whether the verify tests are passed. If decision step 1334 is true, a decision step 1336 determines if there is a next word line to program. If decision step 1336 is false, the programming operation is completed at step 1337. If decision step 1336 is true, a next word line is selected for programming at step 1331. If decision step 1334 is false, step 1335 increments the program voltage and step 1332 applies the next program voltage and other voltages. Each pass through steps 1332-1333 represents a program loop such as in FIG. 7A.

Figure 13D:
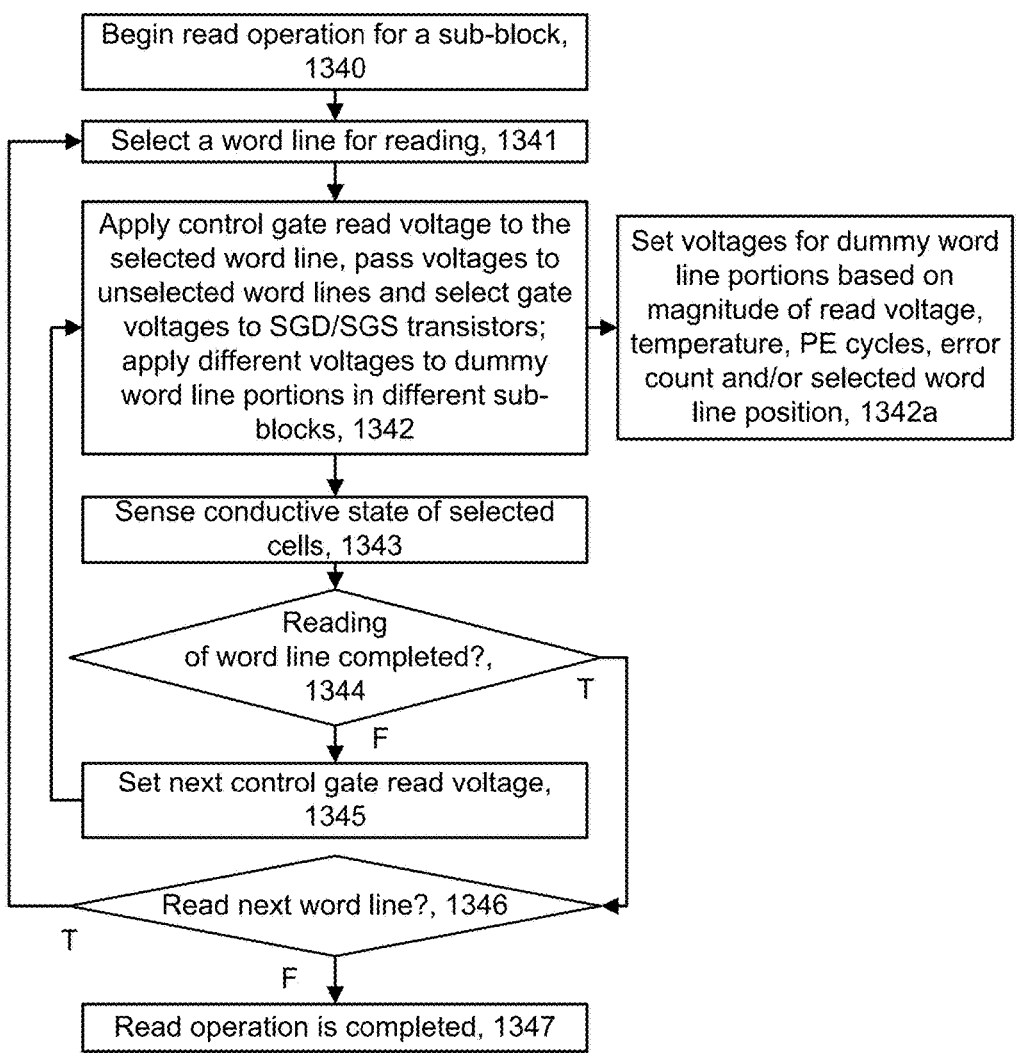
FIG. 13D depicts an example process for reading cells in a sub-block.

FIG. 13D depicts an example process for reading cells in a sub-block. Step 1340 begins a programming operation for a sub-block. Step 1341 selects a word line for reading. Step 1342 includes applying a control gate read voltage to the selected word line, a pass voltage to unselected and dummy word lines, and select gate voltages to SGD/SGS transistors. See, e.g., FIG. 7B. The step also includes applying different voltages to different dummy word line portions in different sub-blocks, as discussed previously. The voltages for the dummy word line portions can be based on various factors. Step 1342a includes setting voltages for the dummy word line portions based on the magnitude of the read voltage, a detected temperature in the memory device, a number of PE cycles of the block or sub-block, an error count from a past read operation in the block or sub-block and/or a position of the selected word line. The voltages can be adjusted such as discussed above in connection with FIG. 13C. Regarding the magnitude of the control gate read voltage (e.g., VrS1-VrS7 in FIG. 7B), a higher read voltage could increase the likelihood of program disturb of the drain-side edge word line but this would be a smaller effect than the effect of Vpgm since the read voltage is typically less than Vpgm.

Step 1343 involves sensing a conductive state of the selected cells, e.g., whether the cells are conductive or non-conductive. This can be done using sensing circuitry connected to the memory strings via bit lines.

A decision step 1344 determines if reading of the selected word line is completed, e.g., whether all of the control gate read voltages have been applied. If decision step 1344 is true, a decision step 1346 determines if there is a next word line to read. If decision step 1346 is false, the read operation is completed at step 1347. If decision step 1346 is true, a next word line is selected for reading at step 1341. If decision step 1344 is false, step 1345 sets the next control gate read voltage and step 1342 applies the next control gate read voltage and other voltages.

Figure 14A:
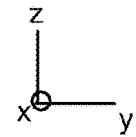
FIG. 14A depicts an example cross-sectional view of a stack of a memory device during a fabrication process consistent with step 1300 of FIG. 13A, where the stack includes alternating dielectric and control gate layers.

FIG. 14A depicts an example cross-sectional view of a stack of a memory device during a fabrication process consistent with step 1300 of FIG. 13A, where the stack includes alternating dielectric and control gate layers. The dielectric layers may comprise oxide and the control gate layers may comprise $Si_3N_4$, for example, at this stage. The stack 1400 includes a substrate 611 such as discussed in connection with FIG. 3A.

Figure 14B:
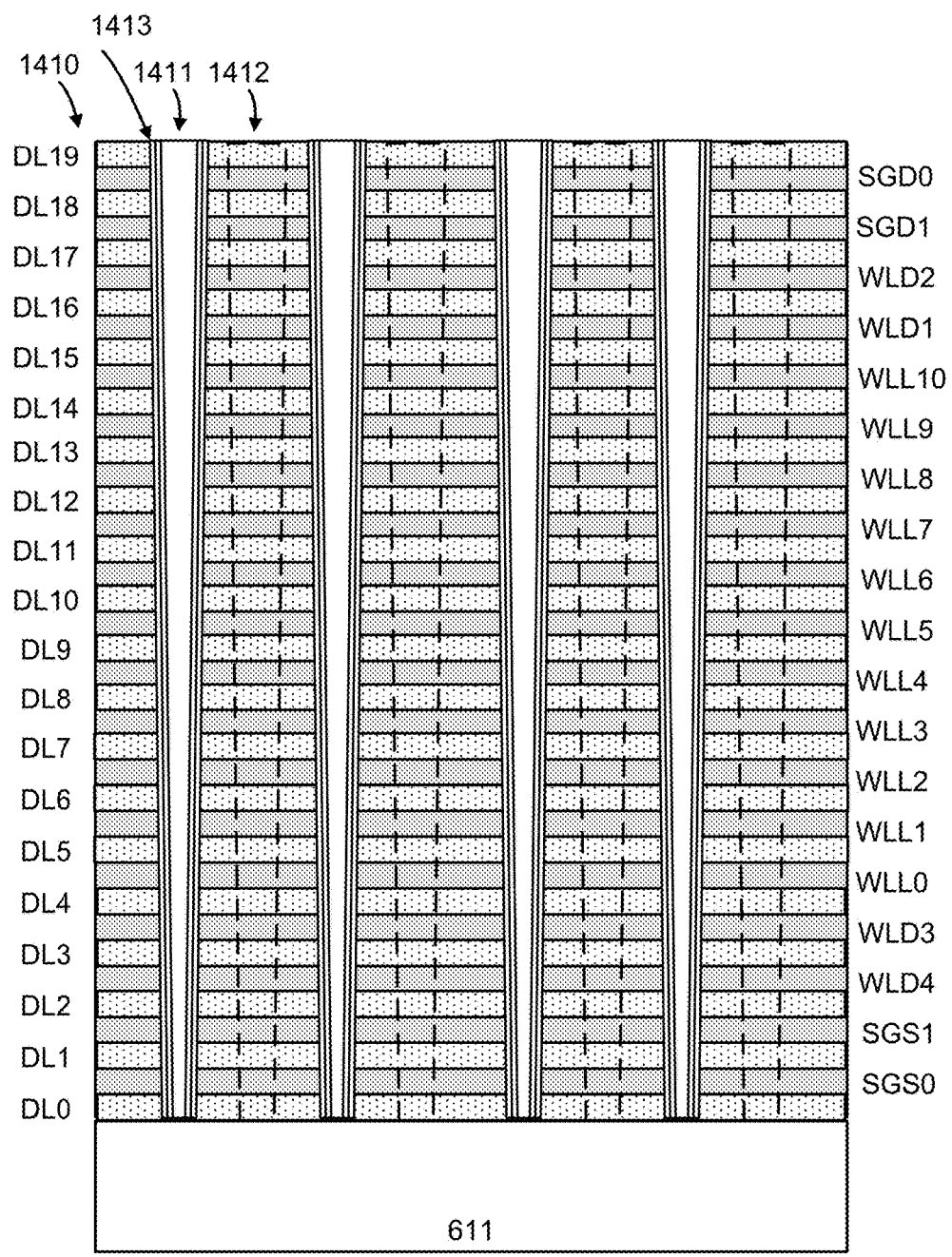
FIG. 14B depicts an example cross-sectional view of the stack of FIG. 14A after memory holes are formed, layers are deposited in the memory holes, and a dielectric core is deposited in the memory holes, consistent with steps 1301, 1032 and 1303, respectively, of FIG. 13A.

FIG. 14B depicts an example cross-sectional view of the stack of FIG. 14A after memory holes are formed, layers are deposited in the memory holes, and a dielectric core is deposited in the memory holes, consistent with steps 1301, 1032 and 1303, respectively, of FIG. 13A. The stack 1410 includes memory holes including example memory hole 1411 which is visible in the cross-sectional view and memory hole 1412 which is projected by a dashed line onto the cross-sectional view. The blocking oxide layer, charge trapping layer, tunneling layer and channel layer are represented by the films 1413 along the sidewall of the memory hole 1411.

FIG. 14C depicts an example cross-sectional view of the stack of FIG. 14B after slits 1414 and 1415 are formed in the stack, consistent with step 1304 of FIG. 13A. The slits may be formed by etching and may extend along the z-axis and the x-axis along the stack. The sacrificial material 1416 of the control gate layers is also depicted along with the dielectric material 1417 of the dielectric layers.

FIG. 14D depicts an example cross-sectional view of the stack of FIG. 14C after the sacrificial material 1416 of the control gate layers is removed by providing an etchant in the slit, thereby forming a void 1418, consistent with step 1305 of FIG. 13A.

FIG. 14E depicts an example cross-sectional view of the stack of FIG. 14D after depositing a metal in the control gate layers via the slit, consistent with step 1306 of FIG. 13A. The metal includes portions such as the portion 1419 which fills the voids of the control gate layers, and a portion 1420 which lines the slit.

FIG. 14F depicts an example cross-sectional view of the stack of FIG. 14E after cleaning and filling in the slit, consistent with step 1306 of FIG. 13A. The metal which lines the slit is cleaned away to avoid short circuiting the control gate layers. After the cleaning, an insulating liner 1421 such as $SiO_2$ is deposited in the slit and the bottom of the liner is etched through. An adhesion layer such as titanium nitride (TiN) may be deposited before the metal 1422. The metal forms a continuous conductive path from a bottom of the stack to the top of the stack and can therefore act as a local interconnect. Local interconnects 1429 and 1430 are thus formed. A conductive path in the substrate may be formed which is connected to the bottom of each LI.

Figure 14G:
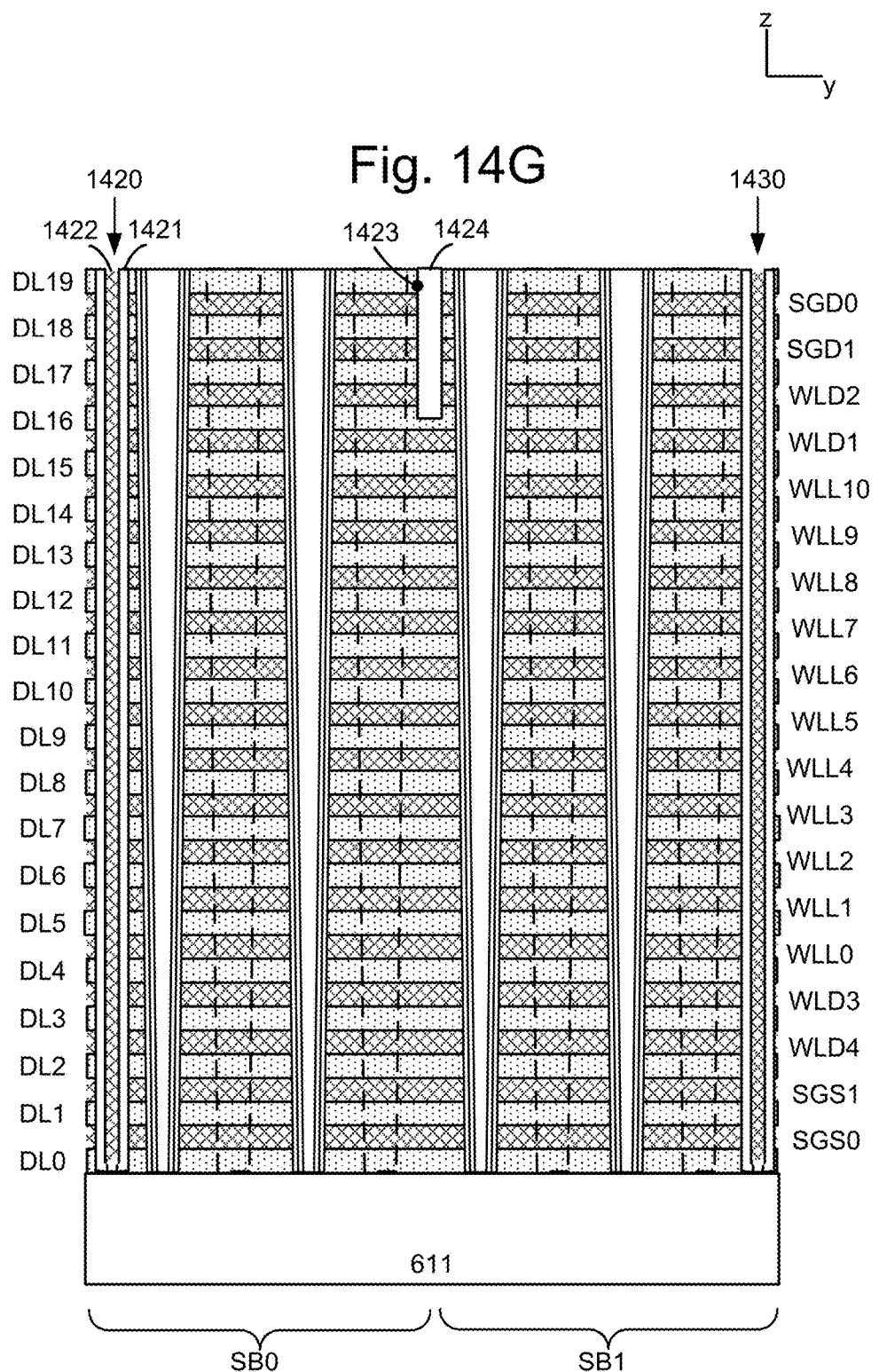
FIG. 14G depicts an example cross-sectional view of the stack of FIG. 14F after etching an additional slit 1423 and filling in the slit with insulation to provide an isolation region 1424, consistent with step 1307 of FIG. 13A.

FIG. 14G depicts an example cross-sectional view of the stack of FIG. 14F after etching an additional slit 1423 and filling in the slit with insulation to provide an isolation region 1424, consistent with step 1307 of FIG. 13A. The stack may encompass sub-blocks SB0 and SB1, for example.

Figure 15:
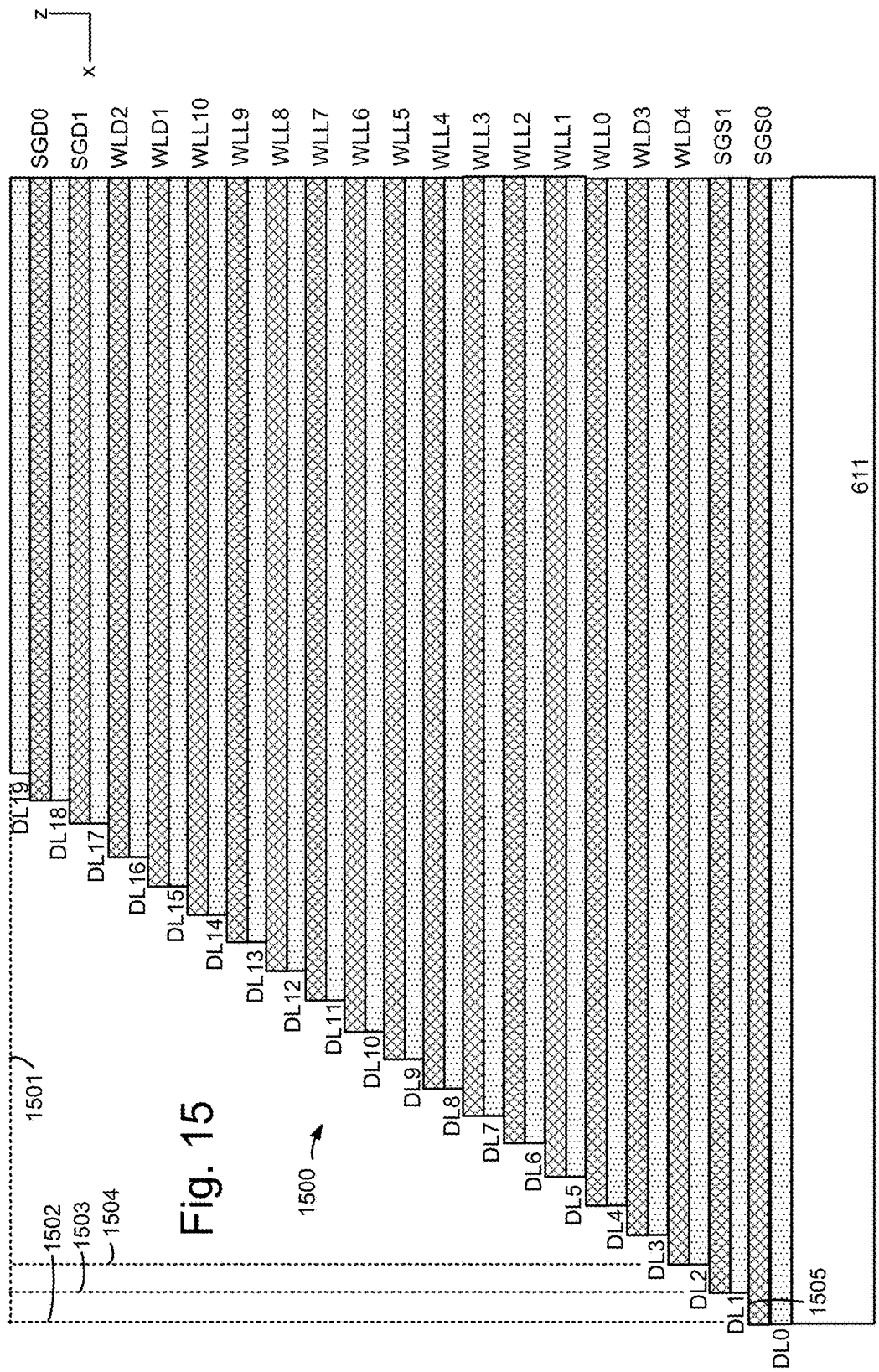
FIG. 15 depicts terraces formed in the stack of FIG. 14G, consistent with step 1308 of FIG. 13A.

FIG. 15 depicts terraces 1500 formed in the stack of FIG. 14G, consistent with step 1308 of FIG. 13A. In the fabrication process, a portion of the stack extends beyond the active area in which the memory strings are formed, e.g., in the +x and −x directions. The +x direction is shown here. Terraces or steps are formed for each control gate layer so that a top surface of each control gate layer is exposed and available on which to form a contact. The contact may be a pillar as discussed previously which extends up to a metallization layer, which in turn is connected to voltage drivers. This allows voltages to be supplied to the control gate layers. A control gate layer is meant to include any of the SGS and SGD layers, and the data and dummy word line layers, as well as portions of any of these layers.

The etching process which forms the terraces can include a series of etching steps. Each etching step etches away a portion of one dielectric layer and one metal control gate layer, for example, starting from the bottom layers and working up to the top layers. The dotted line 1502 shows one side of the stack before the etching of the terraces and the dotted line 1501 shows a corresponding top surface of the stack. The dotted line 1503 shows the one side of the stack after etching the terrace for SGS0 and exposing a top surface 1505 of SGS0. The dotted line 1504 shows the one side of the stack after etching the terrace for SGS1 and exposing a top surface of SGS1. The process continues for each successive control gate layer until the terrace for SGD0 has been formed.

Figure 16A:
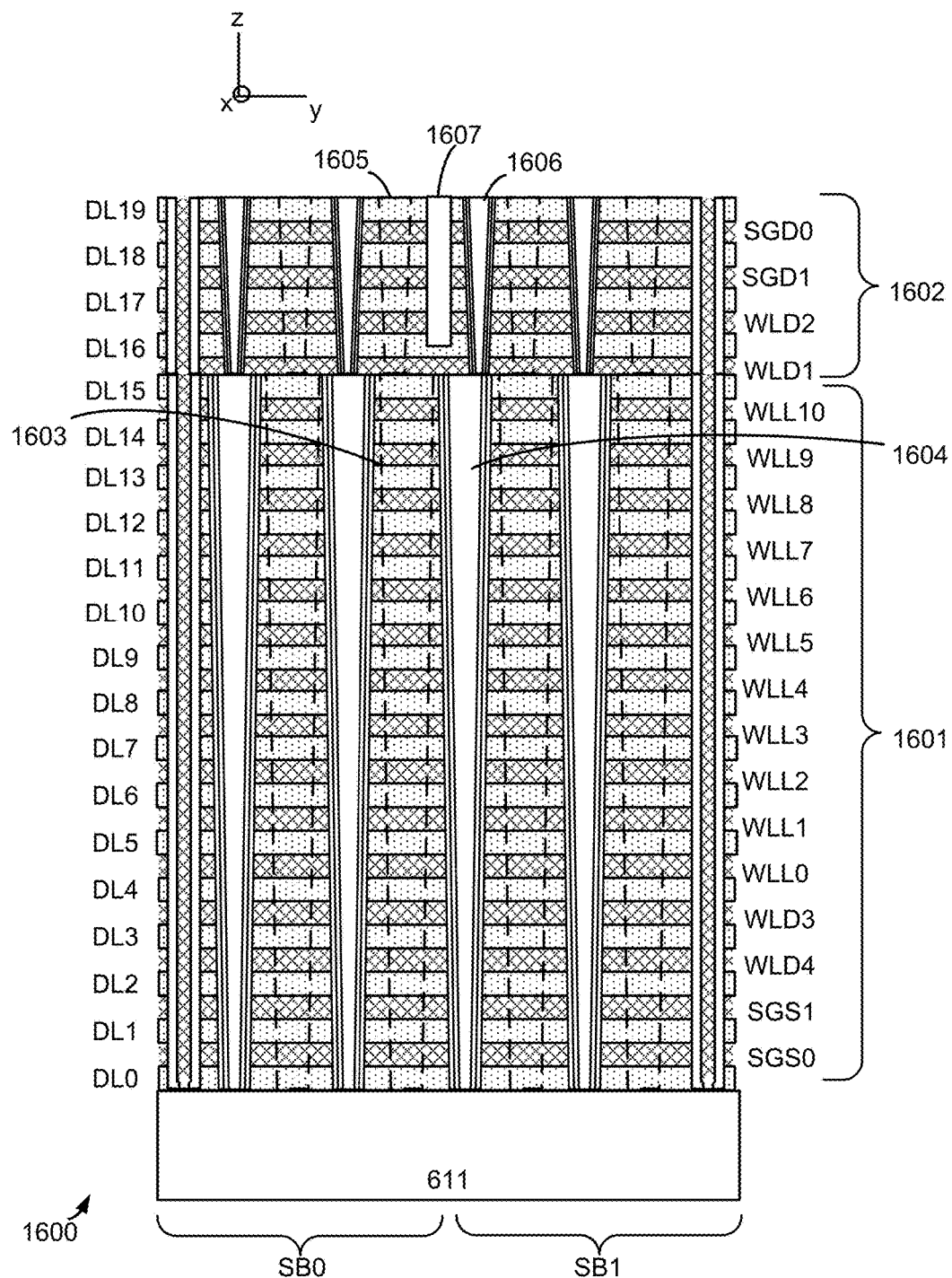
FIG. 16A depicts a stack comprising two portions consistent with the process of FIG. 13B.

FIG. 16A depicts a stack 1600 comprising two portions consistent with the process of FIG. 13B. A first, bottom portion 1601 and a second, top portion 1602 are depicted. The stack could be provided using more than two portions as well. The bottom portion includes the SGS layers and data word line layers, while the top portion includes the dummy word line layers and SGD layers, in this example. Compared to the embodiment of FIG. 14G, the height of each pillar in the bottom portion is reduced. A pillar in this context refers to the materials which fill a memory hole and form all or part of a memory string. A width at the top of each pillar is also reduced since the pillars have a tapered shape, narrowing at the bottom and widening at the top, due to the etching process for the memory holes. For a relatively shorter stack portion, the pillar is narrower at the top because the duration of the etching process can be reduced while still reaching the bottom of the stack. See also FIGS. 16B and 16C. The height of each pillar in the top portion is even less than in the bottom portion so that the width of each pillar in the top portion is smaller than in the bottom portion. This provides greater flexibility in positioning the isolation regions which separate the SGD layers and the dummy word line layers, in a way which reduces the width of the stack.

In this approach, a plurality of data memory cells are arranged in lower pillars (e.g., pillars 1603 and 1604) in the stack, e.g., in the first stack portion. The dummy memory cells and select gate transistors of the one or more select gate layers are arranged in upper pillars (e.g., pillars 1605 and 1606) in the stack, in the second stack portion, above each of the lower pillars. A width (e.g., diameter) at the top of each of the upper pillars is less than a width at the top of each of the lower pillars. The isolation region 1607 is depicted between the pillars 1605 and 1606, extending through the WLD2, SGD1 and SGD0 layers, but not the WLD1 layer, consistent with FIG. 11A. The stack may encompass sub-blocks SB0 and SB1, for example.

The embodiment of FIG. 16A could be modified to include only the layers which are separated by the isolation region, e.g., WLD2, SGD1 and SG0. In this case, WLD1 could be included as the top control gate layer of the bottom portion of the stack. In another approach, the embodiment of FIG. 16A could be modified to include one or more of the data word line layers in the top portion of the stack. In general, by forming the stack in two or more portions, the space consumed by the memory holes or pillars is reduced, and additional space is created in the top portion for the isolation region. Additionally, there is the opportunity to reduce the size of the stack by offsetting the top pillars from the respective bottom pillars adjacent to the isolation region.

Figure 16B:
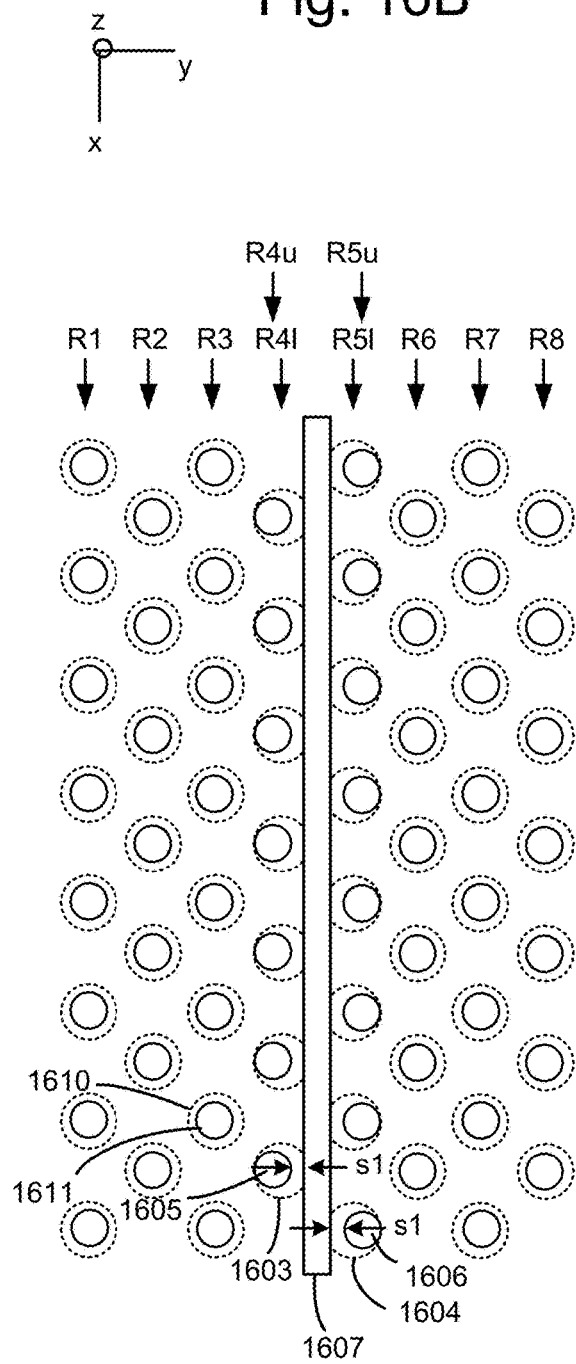
FIG. 16B depicts a top view of the memory holes and isolation region 1607 of FIG. 16A.

FIG. 16B depicts a top view of the memory holes and isolation region 1607 of FIG. 16A. The memory holes or pillars are arranged in rows R1, R2, R3, R6, R7 and R8, consistent with FIG. 10C. The lower pillars adjacent to one side of the isolation region 1607 are arranged in a row R4l and the corresponding upper pillars are arranged in a row R4u. The lower pillars adjacent to another side of the isolation region 1607 are arranged in a row R5l and the corresponding upper pillars are arranged in a row R5u. R4u is offset from R4l and R5u is offset from R5l. For example, the upper pillar 1605 is on top of, and overlapping with, but offset relative to, the lower pillar 1603. It is offset in a direction (−y direction) which is away from the isolation region 1607 to provide a spacing s1 from the isolation region which is greater than if the pillar 1605 was not offset relative to the pillar 1603. Similarly, the upper pillar 1606 is on top of, and overlapping with, but offset relative to, the lower pillar 1604. It is offset in a direction (+y direction) which is away from the isolation region 1607 to provide a spacing s1 from the isolation region which is greater than if the pillar 1606 was not offset relative to the pillar 1604.

For the rows which are not adjacent to an isolation region, the upper pillar can be on top of, and aligned with, the lower pillar. For example, the upper pillar 1611 is on top of, and aligned with, the lower pillar 1610.

Figure 16C:
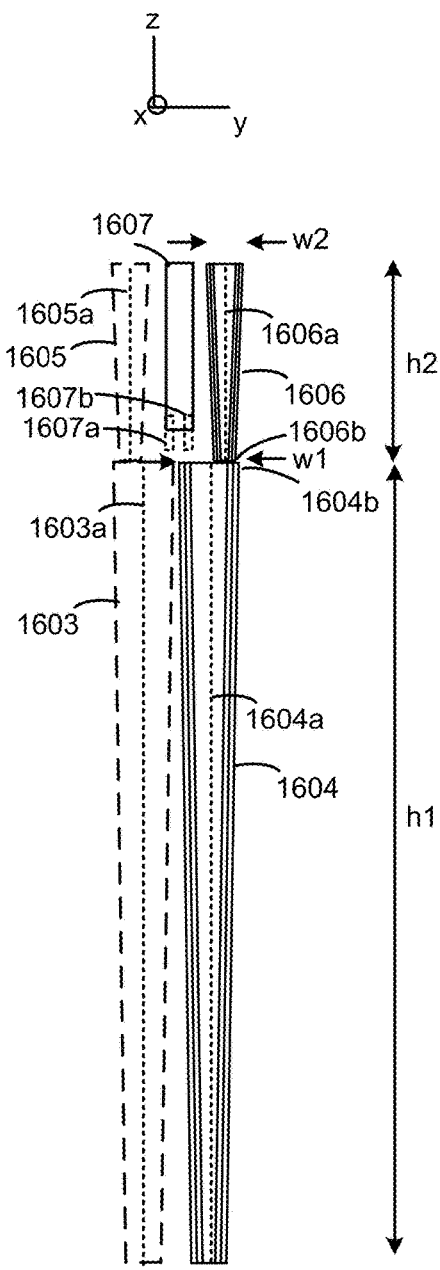
FIG. 16C depicts a side view of the lower pillars 1603 and 1604, the corresponding upper pillars 1605 and 1606, and the isolation region 1607 of FIGS. 16A and 16B.

FIG. 16C depicts a side view of the lower pillars 1603 and 1604, the corresponding upper pillars 1605 and 1606, and the isolation region 1607 of FIGS. 16A and 16B. Each pillar has centerline or central axis which extends vertically or longitudinally through the pillar at its center. The centerline 1605a of the pillar 1605 is offset in the −y direction from the centerline 1603a of the pillar 1603. The centerline 1606a of the pillar 1606 is offset in the +y direction from the centerline 1604a of the pillar 1604. The lower pillars have a width w1 at their top surface and the upper pillars have a smaller width w2 at their top surface. Moreover, the bottom surface of each top pillar is in contact with the top surface of the corresponding bottom pillar, to provide a conductive path through the channels of both pillars. For example, the bottom surface 1606b of the top pillar 1606 is in contact with the top surface 1604b of the corresponding bottom pillar 1604. The upper pillars have a height h2 which is less than the height h1 of the lower pillars.

FIG. 16A to 16C provided an example of a plurality of data memory cells arranged in lower pillars in a stack, where the dummy memory cells and select gate transistors of the one or more select gate layers are arranged in upper pillars in the stack above each of the lower pillars, and a width w2 at a top of each of the upper pillars is less than a width w1 at a top of each of the lower pillars. Moreover, each pillar of the upper pillars and the lower pillars is tapered and is narrower at a bottom than at a top.

The isolation region 1607 separates one row R4u of the upper pillars in one of the sub-blocks SB0 from another, adjacent row R5u of the upper pillars in another of the sub-blocks SB1. The one row R4u of the upper pillars overlaps the one row R4l of the lower pillars and is offset from the one row of the lower pillars in a direction (−y) moving away from the isolation region. Another row R5u of the upper pillars which is adjacent to the one row R4u of the upper pillars overlaps the another row R5l of the lower pillars and is offset from the another row of the lower pillars in a direction (+y) moving away from the isolation region. Additionally, the isolation region 1617 may overlap the lower pillars in the one row R4l of the lower pillars and/or the lower pillars in the another row R5l of the lower pillars. For example, a portion 1607a of the isolation region overlaps the lower pillar 1603 and a portion 1607b of the isolation region overlaps the lower pillar 1604. This provides for a more compact structure.

Figure 17:
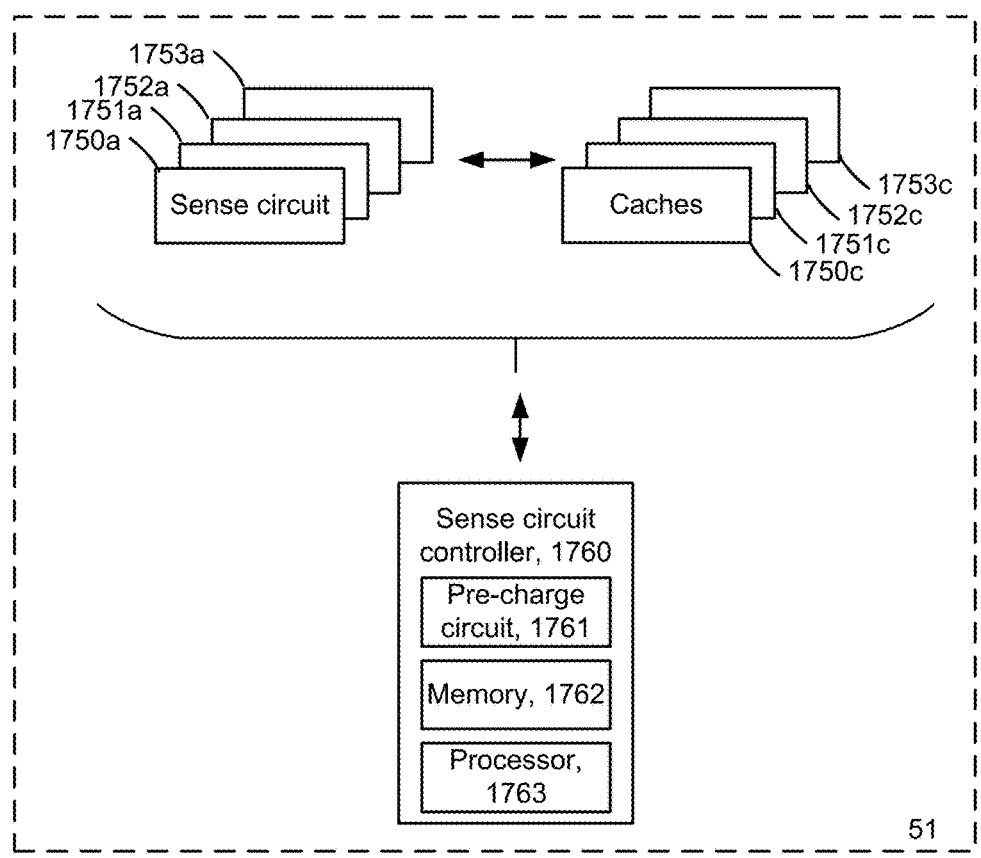
FIG. 17 depicts an example block diagram of a sense block 51 in the column control circuitry of FIG. 1.

FIG. 17 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 1750a, 1751a, 1752a and 1753a are associated with caches 1750c, 1751c, 1752c and 1753c, respectively.

In one approach, different subsets of bit lines can be sensed using different respective sense blocks. This allows the processing load which is associated with the sense circuits to be divided up and handled by a respective processor in each sense block. For example, a sense circuit controller 1760 can communicate with the set, e.g., sixteen, of sense circuits and latches. The sense circuit controller may include a pre-charge circuit 1761 which provides a voltage to each sense circuit for setting a pre-charge voltage. The sense circuit controller may also include a memory 1762 and a processor 1763.

FIG. 18 depicts an example circuit for providing voltages to blocks of memory cells. In this example, a row decoder 1801 provides voltages to word lines and select gates of each block in set of blocks 1810. The set could be in a plane and includes blocks BLK0 to BLK7, for instance. The row decoder provides a control signal to pass gates 1822 which connect the blocks to the row decoder. Typically, operations, e.g., program, read or erase, are performed on one selected block at a time. The row decoder can connect global control lines 1802 to local control lines 1803. The control lines represent conductive paths. Voltages are provided on the global control lines from voltage sources 1820. The voltage sources may provide voltages to switches 1821 which connect to the global control lines. Pass gates 1824, also referred to as pass transistors or transfer transistors, are controlled to pass voltages from the voltage sources 1820 to the switches 1821.

The voltage sources 1820 can provided voltages on data and dummy word lines (WL) and dummy word line portions, SGS layers and SGD layer portions, for example.

The various components, including the row decoder, may receive commands from a controller such as the state machine 112 or the controller 122 to perform the functions described herein.

A source line voltage source 1830 provides a voltage to the source lines/diffusion region in the substrate via control lines 1832. In one approach, the source diffusion region 1833 is common to the blocks. A set of bit lines 1842 is also shared by the blocks. A bit line voltage source 1840 provides voltages to the bit lines. In one possible implementation, the voltage sources 1820 are near the bit line voltage source.

In one embodiment, a memory device comprises: a plurality of conductive layers which are vertically spaced apart from one another by dielectric layers in a stack, the plurality of conductive layers comprising a set of data word line layers, a set of dummy word line layers above the set of data word lines layers, and one or more select gate layers above the set of dummy word line layers; and a plurality of data memory cells arranged in a plurality of sub-blocks in the stack, the plurality of memory cells comprise data memory cells connected to the set of data word line layers and dummy memory cells connected to the set of dummy word line layers, wherein the one or more select gate layers comprise a separate select gate layer portion for each sub-block of the plurality of sub-blocks, a topmost dummy word line layer of the set of dummy word line layers comprises N separate portions, where N is an integer of two or more, and another dummy word line layer, below the topmost dummy word line layer, comprise a single portion which is common to the plurality of sub-blocks, or fewer than N separate portions.

In another embodiment, a method comprises: (a) applying a voltage to a selected data word line layer, wherein: the selected data word line layer is among a plurality of conductive layers which are vertically spaced apart from one another by dielectric layers in a stack; the plurality of conductive layers comprise a set of data word line layers, a set of dummy word line layers above the set of data word lines layers, and one or more select gate layers above the set of dummy word line layers; a plurality of data memory cells are arranged in a plurality of sub-blocks in the stack; the plurality of memory cells comprise data memory cells connected to the set of data word line layers and dummy memory cells connected to the set of dummy word line layers; the one or more select gate layers comprise a separate select gate layer portion for each sub-block of the plurality of sub-blocks; and a dummy word line layer of the set of dummy word line layers comprises N separate portions, where N is an integer of two or more; and (b) during the voltage applied to the selected data word line layer, applying a voltage on a selected dummy word line layer portion of the selected sub-block which is higher than a voltage on unselected dummy word line layer portions of the unselected sub-blocks.

In another embodiment, an apparatus comprises: a stack comprising a set of data word line layers, a set of dummy word line layers above the set of data word lines layers, and one or more select gate layers above the set of dummy word line layers, a dummy word line layer of the set of dummy word line layers comprises separate portions; a plurality of data memory cells arranged in a plurality of sub-blocks in the stack; means for applying a voltage to a selected data word line layer in the stack; and means for applying a voltage on a selected dummy word line layer portion of a selected sub-block which is higher than a voltage on unselected dummy word line layer portions of unselected sub-blocks.

The means can include the control circuits such as the power control module 116 and the column decoder 132 of FIG. 1A, and the voltage sources of FIG. 18 or other logic hardware, and/or other executable code stored on a computer readable storage medium. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A memory device, comprising:
 a plurality of conductive layers which are vertically spaced apart from one another by dielectric layers in a vertical stack of conductive layers, the plurality of conductive layers comprising a set of data word line layers, a set of dummy word line layers above the set of data word line layers, and a set of select gate layers above the set of dummy word line layers;
 the set of dummy word line layers comprises a second dummy word line layer stacked above a first dummy word line layer in the stack, wherein the first dummy word line layer comprises a first set of separate conductive dummy word line layer portions that are not electrically connected to one another, and the second dummy word line layer comprises a second set of separate conductive dummy word line layer portions that are not electrically connected to one another;
 the set of select gate layers includes a select gate layer comprising separate conductive select gate layer portions that are not electrically connected to one another, and are arranged, respectively, above the separate conductive dummy word line layer portions of the second set of separate conductive dummy word line layer portions of the second dummy word line layer; and
 a plurality of memory cells surrounded by the vertical stack of conductive layers and arranged in a plurality of sub-blocks, the plurality of memory cells comprise data memory cells electrically connected to the set of data word line layers, first dummy memory cells electrically connected to the first set of separate conductive dummy word line layer portions of the first dummy word line layer, and second dummy memory cells electrically connected to the second set of separate conductive dummy word line layer portions of the second dummy word line layer, wherein each conductive dummy word line layer portion of the second set of separate conductive dummy word line layer portions of the second dummy word line layer corresponds to a respective sub-block of the plurality of sub-blocks, and each dummy word line layer portion of the first set of separate conductive dummy word line layer portions of the first dummy word line layer is shared among sub-blocks of the plurality of sub-blocks.
2. The memory device of claim 1, further comprising select gate transistors connected to the separate conductive select gate layer portions, wherein:
 the data memory cells are arranged in lower pillars;
 the dummy memory cells and the select gate transistors are arranged in upper pillars above each of the lower pillars; and a width at a top of each of the upper pillars is less than a width at a top of each of the lower pillars.

3. The memory device of claim 2, wherein:
each pillar of the upper pillars and the lower pillars is tapered and is narrower at a bottom than at a top.

4. The memory device of claim 2, wherein:
an isolation region separates one row of the upper pillars in one of the sub-blocks from another, adjacent row of the upper pillars in another of the sub-blocks;
one row of the upper pillars overlaps one row of the lower pillars and is offset from the one row of the lower pillars in a direction moving away from the isolation region; and
another row of the upper pillars which is adjacent to the one row of the upper pillars overlaps another row of the lower pillars and is offset from the another row of the lower pillars in a direction moving away from the isolation region.

5. The memory device of claim 4, wherein:
the isolation region overlaps the lower pillars in the one row of the lower pillars and the lower pillars in the another row of the lower pillars.

6. The memory device of claim 1, wherein:
the second set of separate conductive dummy word line layer portions comprise N separate conductive dummy word line layer portions; and
the first set of separate conductive dummy word line layer portions comprises two or more but fewer than N separate conductive dummy word line layer portions.

7. The memory device of claim 1, further comprising:
circuitry configured to provide a voltage on a selected data word line layer in the set of data word line layers, and to apply a voltage on a selected dummy word line layer portion of the second set of separate conductive dummy word line layer portions of the second dummy word line layer which is higher than a voltage on unselected dummy word line layer portions of the second set of separate conductive dummy word line layer portions of the second dummy word line layer.

8. The memory device of claim 7, wherein:
the voltage on the selected data word line layer comprises a program voltage; and
the voltage the unselected dummy word line layer portions is a function of a magnitude of the program voltage.

9. The memory device of claim 1, wherein:
a ramp up rate of a voltage on a dummy word line layer portion of the second set of separate conductive dummy word line layer portions of the second dummy word line layer in a selected sub-block of the plurality of sub-blocks is different than a ramp up rate of a voltage on dummy word line layer portions of the second set of separate conductive dummy word line layer portions of the second dummy word line layer in of unselected sub-blocks of the plurality of sub-blocks.

10. A method, comprising:
applying a voltage to a selected data word line layer, wherein:
the selected data word line layer is among a plurality of data word line layers, which are among a vertical stack of a plurality of conductive layers that are vertically spaced apart from one another by dielectric layers;
the plurality of conductive layers comprise a set of dummy word line layers above the plurality of data word line layers, and a set of select gate layers above the set of dummy word line layers;

the set of dummy word line layers includes a second dummy word line layer stacked above a first dummy word line layer, wherein the second dummy word line layer comprises separate conductive dummy word line layer portions that are not electrically connected to one another;
the set of select gate layers includes a select gate layer comprising separate conductive select gate layer portions that are not electrically connected to one another, and are arranged, respectively, above the separate conductive dummy word line layer portions of the second dummy word line layer; and
a plurality of memory cells surrounded by the vertical stack of conductive layers and arranged in a plurality of sub-blocks, the plurality of memory cells comprise data memory cells electrically connected to the set of data word line layers, first dummy memory cells electrically connected to the first dummy word line layer, and second dummy memory cells electrically connected to the separate conductive dummy word line layer portions of the second dummy word line layer, wherein each of the separate conductive dummy word line layer portions of the second dummy word line layer corresponds to a respective sub-block of the plurality of sub-blocks; and
during the applying of the voltage to the selected data word line layer, applying a voltage on a selected dummy word line layer portion of the separate conductive dummy word line layer portions of the second dummy word line layer which is higher than a voltage applied to unselected dummy word line layer portions of the separate conductive dummy word line layer portions of the second dummy word line layer, wherein the voltage applied to the selected data word line layer comprises a program voltage and the voltage on the unselected dummy word line layer portions is a function of a magnitude of the program voltage.

11. The method of claim 10, wherein:
the separate conductive dummy word line layer portions of the second dummy word line layer comprise N dummy word line layer portions; and
the first dummy word line layer comprises separate conductive dummy word line layer portions that are not electrically connected to one another; and
the separate conductive dummy word line layer portions of the first dummy word line layer comprise two or more but fewer than N separate conductive dummy word line layer portions.

12. The method of claim 10, wherein:
the voltage on the unselected dummy word line layer portions is relatively lower when a temperature is relatively higher.

13. An apparatus, comprising:
a plurality of conductive layers which are vertically spaced apart from one another by dielectric layers in a vertical stack of conductive layers, the plurality of conductive layers comprising a set of data word line layers, a set of dummy word line layers above the set of data word line layers, and a set of select gate layers above the set of dummy word line layers;
the set of dummy word line layers comprises a second dummy word line layer stacked above a first dummy word line layer in the stack, wherein the second dummy word line layer comprises a set of separate conductive dummy word line layer portions that are not electrically connected to one another;

the set of select gate layers includes a select gate layer comprising separate conductive select gate layer portions that are not electrically connected to one another, and are arranged, respectively, above the separate conductive dummy word line portions of the set of separate conductive dummy word line layer portions of the second dummy word line layer;

a plurality of memory cells surrounded by the vertical stack of conductive layers and arranged in a plurality of sub-blocks, the plurality of memory cells comprise data memory cells electrically connected to the set of data word line layers, first dummy memory cells electrically connected to the first dummy word line layer, and second dummy memory cells electrically connected to the set of separate conductive dummy word line layer portions of the second dummy word line layer, wherein each of the separate conductive dummy word line layer portions of the second dummy word line layer corresponds to a respective sub-block of the plurality of sub-blocks;

circuitry configured to apply a voltage to a selected data word line layer of the set of data word line layers, and to apply a voltage on a selected dummy word line layer portion of the set of separate conductive dummy word line layer portions of the second dummy word line layer that is higher than a voltage on unselected dummy word line layer portions of the set of separate conductive dummy word line layer portions of the second dummy word line layer; and a temperature-sensing circuit configured to provide data indicating a temperature, wherein the voltage applied on the unselected dummy word line layer portions is relatively lower when the temperature is relatively higher.

14. The apparatus of claim 13, wherein the voltage applied to the selected data word line layer comprises a program voltage, and the circuitry is configured to make the voltage on the unselected dummy word line layer portions a function of a magnitude of the program voltage.

15. The apparatus of claim 13, wherein:
the circuitry is configured to apply a voltage on a selected select gate layer portion of the separate conductive select gate layer portions which is higher than a voltage on unselected select gate layer portions of the separate conductive select gate layer portions.

16. The memory device of claim 1, further comprising:
a vertically extending contact connected to each of the separate conductive dummy word line layer portions of the first dummy word line layer and to each of the separate conductive dummy word line layer portions of the second dummy word line layer, each vertically extending contact is connected to a respective voltage driver.

17. The apparatus of claim 13, further comprising:
a vertically extending contact connected to each of the separate conductive dummy word line layer portions of the second dummy word line layer, each vertically extending contact is connected to a respective voltage driver.

18. The method of claim 10, wherein:
the voltage on the unselected dummy word line layer portions is relatively lower when the magnitude of the program voltage is relatively higher.

\* \* \* \* \*